United States Patent
Chai et al.

(10) Patent No.: US 12,415,721 B2
(45) Date of Patent: Sep. 16, 2025

(54) HIGH RATE PRINTING OF MICROSCALE AND NANOSCALE PATTERNS USING INTERFACIAL CONVECTIVE ASSEMBLY

(71) Applicant: Northeastern University, Boston, MA (US)

(72) Inventors: Zhimin Chai, Revere, MA (US); Adnan Korkmaz, Edison, NJ (US); Cihan Yilmaz, Campbell, CA (US); Ahmed A. Busnaina, Needham, MA (US)

(73) Assignee: Northeastern University, Boston, MA (US)

( * ) Notice: Subject to any disclaimer, the term of this patent is extended or adjusted under 35 U.S.C. 154(b) by 372 days.

(21) Appl. No.: 17/918,211

(22) PCT Filed: Apr. 12, 2021

(86) PCT No.: PCT/US2021/026893
§ 371 (c)(1),
(2) Date: Oct. 11, 2022

(87) PCT Pub. No.: WO2021/207734
PCT Pub. Date: Oct. 14, 2021

(65) Prior Publication Data
US 2023/0145232 A1    May 11, 2023

Related U.S. Application Data

(60) Provisional application No. 63/008,570, filed on Apr. 10, 2020.

(51) Int. Cl.
*B81C 1/00* (2006.01)
(52) U.S. Cl.
CPC ...... *B81C 1/00373* (2013.01); *B81C 1/00063* (2013.01)

(58) Field of Classification Search
CPC ............ B81C 1/00373; B81C 1/00063; B81C 1/00031
See application file for complete search history.

(56) References Cited

U.S. PATENT DOCUMENTS

| | | | |
|---|---|---|---|
| 2008/0053369 A1 | 3/2008 | Park et al. | |
| 2013/0287999 A1* | 10/2013 | Cha | B05D 7/22 427/256 |

(Continued)

FOREIGN PATENT DOCUMENTS

WO    WO-2020089901 A1 *    5/2020    ............... C01G 7/00

OTHER PUBLICATIONS

J. W. M. Bush, Interfacial Phenomena, Chapter 9: Marangoni Flows, MIT Open Course Ware 18.357, Fall 2010, pp. 30-33. Retrieved from https://ocw.mit.edu/courses/18-357-interfacial-phenomena-fall-2010/ebad47a511d146bd949f249eb5e4e046_MIT18_357F10_Lecture9.pdf on Dec. 12, 2024. (Year: 2010).*

(Continued)

*Primary Examiner* — William P Fletcher, III
(74) *Attorney, Agent, or Firm* — Verrill Dana, LLP

(57) ABSTRACT

Interfacial convective assembly can assemble any type of nanoparticles or other nanoelements in minutes to form microscale and nanoscale patterns in vias or trenches in patterned substrates. A solvent film is deposited on a patterned substrate. An aqueous suspension of nanoparticles is deposited onto the solvent film, thereby forming an interfacial liquid system comprising the nanoparticles within an enclosed space on the substrate. The substrate is then heated, thereby inducing convective flow in the interfacial liquid system. The convective flow includes solutal Marangoni convective flow in a direction towards the patterned substrate, causing nanoelements to be transferred to and bind to the patterned substrate. The nanoelements can be assembled on both hydrophilic and hydrophobic surfaces. Nanopar- (Continued)

ticles can fuse during the process to provide solid or single crystalline electrical circuit components.

19 Claims, 24 Drawing Sheets

(56) References Cited

U.S. PATENT DOCUMENTS

| | | | |
|---|---|---|---|
| 2017/0218218 A1* | 8/2017 | Zamoshchik | B41M 5/007 |
| 2017/0235021 A1* | 8/2017 | Boley | G02B 5/205 |
| | | | 359/839 |
| 2019/0113453 A1 | 4/2019 | Zheng et al. | |

OTHER PUBLICATIONS

D. Feng et al., "A Facile Interfacial Self-Assembly of Crystalline Colloidal Monolayers by Tension Gradient," Micromachines 2018, 9, 297. (Year: 2018).*

Deegan et al., "Contact line deposits in an evaporating drop," Physical Rev. E, 2000, 62, 1, 756-765. (Year: 2000).*

Tekin et al., "Ink-jet printing of polymers—from single dots to thin film libraries," J. Mater. Chem., 2004, 14, 2627-2632. (Year: 2004).*

Kim et al., "Direct writing of silver conductive patterns: Improvement of film morphology and conductance by controlling solvent compositions," Appl. Phys. Lett. 89, 264101 (2006). (Year: 2006).*

Park et al., "Control of Colloidal Particle Deposit Patterns within Picoliter Droplets Ejected by Ink-Jet Printing," Langmuir 2006, 22, 3506-3513. (Year: 2006).*

Tekin et al., "Inkjet Printing of Luminescent CdTe Nanocrystal-Polymer Composites," Adv. Funct. Mater. 2007, 17, 23-28. (Year: 2007).*

Chow et al., "Inkjet-printed gold nanoparticle chemiresistors: Influence of film morphology and ionic strength on the detection of organics dissolved in aqueous solution," Analytica Chimica Acta 632 (2009) 135-142. (Year: 2009).*

Chai et al., "High-Rate Printing of Micro/Nanoscale Patterns Using Interfacial Convective Assembly," Adv. Mater., 2020, 2000747-2000755). (Year: 2020).*

Roché et al., "Marangoni Flow of Soluble Amphiphiles," Phys. Rev. Lett. 112, 208302 (2014). (Year: 2014).*

"Spontaneous Pattern Formation Induced by Bérnard-Marangoni Convection for Sol-Gel-Derived Titania Dip-Coating Films: Effect of Co-solvents with a High Surface Tension and Low Volatility," Langmuir 2015, 31, 12497-12504. (Year: 2015).*

Chai et al., "High-Rate Printing of Micro/Nanoscale Patterns Using Interfacial Convective Assembly", Adv. Mater. 2020, 2000747, pp. 1-8.

Critchley et al., "Near-Bulk Conductivity of Gold Nanowires as Nanoscale Interconnects and the Role of Atomically Smooth Interface", Adv. Mater, 2010, 22, pp. 2338-2342.

De Bruyn et al., "Apparatus for the study of Rayleigh-Bénard convection in gases under pressure", Article in Review of Scientific Instruments, Jul. 1996, pp. 1-31.

Grammatikopoulos et al., "Coalescence-induced crystallisation wave in Pd nanoparticles", Nature, Scientific Reports, 2014, 4: 5779, pp. 1-9.

Grammatikopoulos et al., "Computational Modeling of Nanoparticle Coalescence", Advanced Theory Simulations, 2019, 2, 1900013, pp. 1-26.

Henz et al., "Molecular Dynamics Simulation of the Kinetic Reaction between Ni and Al Nanoparticles", Journal of Applied Physics, 2009, 105, 124310, 15 pages.

Kim et al., "Solutal Marangoni flows of miscible liquids drive transport without surface contamination", Nature, Nature Physics, Letters, 2017, vol. 13, pp. 1105-1111.

* cited by examiner (h)

(i)

(a)

(b)

HIGH RATE PRINTING OF MICROSCALE AND NANOSCALE PATTERNS USING INTERFACIAL CONVECTIVE ASSEMBLY

CROSS-REFERENCE TO RELATED APPLICATIONS

This application claims priority to U.S. Provisional Application No. 63/008,570, filed 10 Apr. 2020, which is incorporated by reference herein in its entirety.

STATEMENT REGARDING FEDERALLY SPONSORED RESEARCH OR DEVELOPMENT

The invention was made with government support under Grant Number 0832785 awarded by the National Science Foundation. The government has certain rights in the invention.

BACKGROUND

Printing techniques have drawn growing attention for use in applications such as electronics and sensors because of low cost, low material consumption, high scalability, opportunity of exploiting novel properties of nanomaterials, and advantages of using high throughput and additive manufacturing. However, the commonly used printing techniques, including inkjet printing, gravure printing, and screen printing, have limited scalability and resolution (micron or sub-micron scale). Directed assembly-based printing, on the other hand, is scalable and can realize high resolution of tens of nanometers. Directed assembly is achieved by applying external fields such as electric, magnetic, optical, and flow fields on nanoelements and guiding the nanoelements to targeted sites to form functional structures.

Electric field-directed assembly uses electrophoretic and dielectrophoretic forces to direct nanoelements. Although electric field-directed assembly demonstrates high throughput, high scalability and high resolution in assembling various nanomaterials, conductive substrates are required to generate an electric field, which limits potential applications of printed structures in electronic devices. Fluidic flow-directed assembly, such as convective and capillary assembly, utilizes solvent evaporation-induced convective flow to guide and position nanoelements. Unlike electric field-directed assembly, fluidic flow-directed assembly is applicable to all kinds of substrates, both insulating and conductive. However, it takes hours to assemble nanoelements over centimeter-sized substrates. Therefore, the scalability and throughput of fluidic flow-directed assembly processes is a major challenge. Photothermal-directed assembly uses photothermal effect-induced Rayleigh-Benard and/or Marangoni convective flow to direct assembly. Similar to fluidic flow-directed assembly, photothermal-directed assembly suffers from scalability and throughput issues due to its serial processing nature. In addition, photothermal-directed assembly has a limited resolution of microm or sub-micron scale. Therefore, the development of a broadly applicable, highly scalable, high throughput, and high resolution printing technique is highly desirable.

SUMMARY

The present technology provides interfacial convective assembly, which is a directed assembly-based printing technique that utilizes a substrate heating-induced convective flow to drive particles towards patterned substrates and then uses van der Waals interactions as well as geometrical confinement to trap the particles in the pattern areas.

The present technology can be further summarized by the following list of features.

1. A method of interfacial convective assembly of nanoelements, the method comprising the steps of:
   (a) providing a patterned substrate and an aqueous suspension of nanoparticles;
   (b) depositing a water-miscible solvent, solvent mixture, or solvent-water mixture as a solvent film on the substrate;
   (c) depositing the aqueous suspension of nanoparticles onto the solvent film, thereby forming an interfacial liquid system comprising said nanoparticles;
   (d) confining the interfacial liquid system, or a portion thereof, within an enclosed space on the substrate;
   (e) heating the substrate, thereby inducing convective flow in the interfacial liquid system;
   whereby nanoelements of the interfacial liquid system are transferred to and bind to one or more areas of the patterned substrate.

2. The method of feature 1, wherein the solvent film comprises isopropanol.

3. The method of feature 1 or feature 2, wherein the nanoelements are non-conducting, conducting, or semiconducting.

4. The method of any of the preceding features, wherein the areas of the patterned substrate onto which nanoelements are transferred has a contact angle from 0° to about 130°.

5. The method of any of the preceding features, wherein the areas of the patterned substrate onto which nanoelements are transferred have substantially the same contact angle as areas of the patterned substrate that do not bind nanoelements.

6. The method of any of the preceding features, wherein the areas of the patterned substrate onto which nanoelements are transferred have a lower contact angle than areas of the patterned substrate that do not bind nanoelements.

7. The method of feature 6, wherein the areas of the patterned substrate onto which nanoelements are transferred have a contact angle from about 30° to about 50°, or from about 30° to about 60°, or from 0° to about 60°, and wherein the areas of the patterned substrate that do not bind nanoelements have a contact angle contact angle in the range from about 60° to about 80°, or from about 60° to about 100°, or from about 60° to about 110°, or from about 60° to about 120°, or from about 60° to about 130°.

8. The method of any of the preceding features, wherein the areas of the patterned substrate onto which nanoelements are transferred are sunken below areas of the patterned substrate that do not bind nanoelements, and wherein the difference in height between the areas that do and do not bind nanoelements is at least about the same as the size of the nanoelements.

9. The method of feature 8, wherein nanoelements are deposited into vias or trenches of the patterned substrate.

10. The method of any of the preceding features, wherein the patterned substrate has at least one pattern feature having a dimension in the range from about 1 nm to about 1000 nm, preferably from about 5 nm to about 100 nm.

11. The method of any of the preceding features, wherein the aqueous suspension of nanoelements is drop cast onto the solvent film.
12. The method of any of the preceding features, wherein confining the interfacial liquid system comprises placing a cover over the interfacial liquid system.
13. The method of any of the preceding features, further comprising
    (f) tilting the patterned substrate, whereby non-transferred nanoelements are removed from the patterned substrate.
14. The method of any of the preceding features, wherein the patterned substrate is heated in (e) to a temperature in the range from about 40° C. to about 75° C.
15. The method of any of the preceding features, wherein the method is completed in less than 30 minutes, preferably in less than 10 minutes, more preferably in less than 5 minutes.
16 The method of any of the preceding features, wherein the convective flow transfers at least a portion of the nanoelements to the one or more areas of the patterned substrate that bind the nanoelements.
17. The method of any of the preceding features, wherein the convective flow comprises solutal Marangoni convective flow in a direction towards the patterned substrate.
18. The method of feature 17, wherein the solutal Marangoni convective flow induces a total convective flow of at least about 1 m·S$^{-1}$.
19. The method of any of the preceding features, wherein a patterned monolayer of the nanoelements is deposited onto the substrate.
20. The method of any of the preceding features, wherein the nanoelements are nanoparticles, preferably nanoparticles comprising gold, silver, one or more polymers, carbon, silica, or a combination thereof.
21. The method of feature 20, wherein at least a portion of the transferred nanoparticles fuse together to form a fused nanoparticle structure, such as a single-crystalline structure.
22. The method of feature 21, wherein the fused structure is a nanowire or a nanorod, preferably wherein the fused structure has an electrical resistivity of not more than $2 \times 10^{-4}$ Ω cm.
23. The method of any of the preceding features, wherein the patterned substrate comprises silicon.
24. The method of any of the preceding features, wherein the method does not include electrophoretic or dielectrophoretic assembly of the nanoelements.
25. A method of fabricating a patterned multilayered nanomaterial, the method comprising performing the method of any of the preceding features to assemble a first patterned monolayer of nanoelements followed by repeating the method one or more times to add additional monolayers of the nanoelements on top of the previous monolayer or layers.
26. A device made by the method of any of the preceding features.
27. The device of feature 26 which forms part of an electronic circuit.
28. The device of feature 27 that is selected from the group consisting of a sensor, a solar cell, a battery, a microprocessor, a memory chip, a biosensor, and an antenna.

As used herein, the term "about" refers to a range of within plus or minus 10%, 5%, 1%, or 0.5% of the stated value.

As used herein, "consisting essentially of" allows the inclusion of materials or steps that do not materially affect the basic and novel characteristics of the claim. Any recitation herein of the term "comprising", particularly in a description of components of a composition or in a description of elements of a device, can be exchanged with the alternative expression "consisting of" or "consisting essentially of".

BRIEF DESCRIPTION OF THE DRAWINGS

FIG. 1A illustrates a set up for performing interfacial convective assembly on a patterned substrate on a heated surface. FIG. 1B illustrates a pattern of convective flow in a heated nanoparticle suspension in a solvent gradient.

FIG. 3A shows assembly yield as a function of the substrate temperature at a particle concentration of 25 mg/mL and an assembly time of 2 minutes. FIG. 2B shows assembly yield as a function of the particle concentration at a substrate temperature of 75° C. and an assembly time of 2 minutes. FIG. 2C shows assembly yield as a function of the assembly time at a substrate temperature of 40° C. and a particle concentration of 25 mg/mL. Insets in each subfigure of FIGS. 3A-3C are fluorescence microscopy images corresponding to (3A) 50%, (3B) 100% and (3C) 10% assembly yields.

FIG. 4A shows SEM images of 50 nm gold nanoparticles assembled in an array of 300 nm wide trenches. FIG. 4B shows SEM micrographs of 51 nm polystyrene latex (PSL) nanoparticles assembled in 400 nm wide trenches. FIG. 4C shows SEM micrographs of 30 nm silica nanoparticles assembled in 400 nm wide trenches. FIG. 4D shows an SEM image of 25 nm silver nanoparticles assembled in a 30 nm wide trench, showing assembly with single nanoparticle resolution. FIG. 4E shows an SEM image of 5 nm silver nanoparticles assembled in arrays of 200 nm wide trenches. The silver nanoparticles coalesce during the assembly process, forming sintered nanowire structures, as shown in the inset image. FIG. 4F shows SEM images of 5 nm silver nanoparticles assembled in arrays of 100 nm wide vias. The silver nanoparticles coalesce during the assembly process and form sintered nanorod structures, as shown in the inset image. FIG. 4G shows a transmission electron microscopy (TEM) image of a single silver nanorod, and the inset is an SAED pattern taken from part of the nanorod. FIG. 4H shows a high resolution TEM image of the silver nanorod. FIG. 4I shows I-V curves of four assembled silver nanorods 50 nm in diameter and 150 nm in height.

FIG. 5D shows a fluorescence microscopy image of 100 nm fluorescent silica nanoparticles assembled in an array of vias 600 nm in diameter and with 1.2 µm in spacing, the vias arranged in a world map shape. FIG. 5E is an SEM image showing silica nanoparticles in the vias. FIG. 5F is an SEM image showing assembly of 30 nm silica nanoparticles on a hydrophobic functionalized surface in vias 600 nm in diameter; the inset shows the contact angle measurement of the assembly surface.

DETAILED DESCRIPTION

Figure 1A:
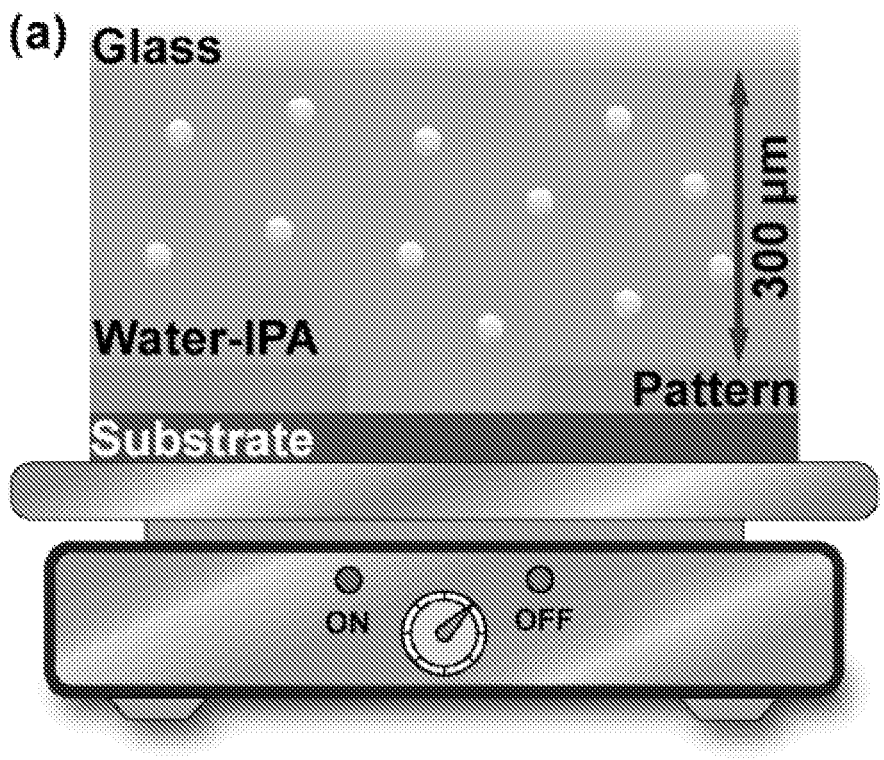
FIGS. 1A-1B show a schematic illustration of an interfacial convective assembly of colloidal particles on a patterned substrate.

The present technology provides a type of directed assembly-based printing technique which is based on interfacial convective assembly. The interfacial convective assembly method starts with depositing a water-miscible solvent film onto a patterned substrate. Next, an aqueous suspension of nanoelements onto the solvent film, thereby forming an interfacial liquid system containing the nanoelements. The interfacial liquid system is then enclosed within a space on the substrate, forming a interfacial convective assembly device. The device is then placed onto a heated surface having a temperature from about 40° C. to about 75° C. Heating of the substrate induces convective flow in the interfacial liquid system, whereby suspended nanoelements are transferred by convective flow to the patterned substrate, where they form a patterned assembly of the nanoelements. Nanoelements can be assembled on either hydrophilic or hydrophobic surfaces.

Without intending to limit the technology to any particular mechanism, it is believed to utilize a substrate heating-induced solutal Marangoni convective flow to drive nanoelements such as nanoparticles towards patterned substrates, whereupon van der Waals interactions as well as geometrical confinement trap the particles in the pattern areas. Several assembly parameters including type of mixing solvent, substrate temperature, particle concentration, and assembly time were shown to influence the assembly process. Successful assembly of different types of nanoparticles into patterns of different shapes was achieved within minutes and with a high resolution down to 25 nm or less. The assembly time of a few minutes is two orders of magnitude faster than conventional convective assembly. Small sized (diameter below 5 nm) nanoparticles tend to coalesce during the assembly process and form sintered structures. For example, silver nanowires and nanorods can be rapidly formed. The fabricated silver nanorods show single crystal structure with a low resistivity of $8.58 \times 10^{-5}$ Ω cm. With high versatility, high resolution, and high throughput, the interfacial convective assembly opens remarkable opportunities for printing next generation nanoelectronics and sensors.

The fluidic flow-directed assembly technique of the present technology utilizes interfacial convective assembly to rapidly assemble particles in patterned areas on any substrate. The substrate has a pattern including sunken areas (below the plane of the substrate), which are intended as areas for nanoelement assembly, separated by higher areas (e.g., having an upper surface at the same height as the original substrate surface prior to performing lithography), which are intended as areas where no nanoelement assembly should occur. The areas that do not bind nanoelements are higher than the areas that do bind nanoelements by a distance at least equal to the size of the nanoelements being assembled. The height difference can be about 1, 1.25, 1.5, 1.75, 2, 3, 4, 5, or even 10 times the average size of the nanoparticles, for example. For nanoelements that are not the same size in all dimensions, the vertical size of the nanoelements when assembled in the patterned areas is the relevant size. Due to geometrical considerations, nanoelements may be assembled in different orientations depending on the shape of the nanoelements and the geometry of the patterned areas that bind the nanoparticles. The patterning of the areas will contain features having a size in the nanoscale (from about 1 nm to about 1000 nm, preferably from about 1 nm to about 100 nm) or in the microscale (from about 1 µm to about 1000 µm, or a combination of both. Thus, structures assembled by the present technology can have at least one dimension in the range from about 1 nm to about 1000 µm, or from about 5 nm to about 100 µm, or any size of about 5 nm or larger. Areas as large as 100 cm² and having any desired shape (e.g., geometrical shapes such as circles, squares, rectangles, squares, triangles, three-dimensional shapes such as rods, or linear shapes such as straight or curved lines) can be filled with assembled nanoelements using the technology.

Patterning of the substrate can include features for nanoelement deposition (sunken features) that are hydrophilic and features that exclude nanoelement deposition (higher features) that are hydrophobic. The hydrophilic features preferably have a contact angle of less than about 5°, or less than about 10°, or less than about 15°, or less than about 20°, or less than about 30°; however, the contact angle of these areas also can be in the range from about 30° to about 50°, or from about 30° to about 60°, or from 0° to about 60°. The hydrophobic features preferably have a contact angle of more than about 60°, or more than about 70°, or more than about 80°, or more than about 90°, or more than 100°; however, the contact angle of these areas also can be in the range from about 60° to about 80°, or from about 60° to about 100°, or from about 60° to about 110°, or from about 60° to about 120°, or from about 60° to about 130°. It should be noted that experiments confirmed that nanoelement assembly occurs on hydrophobic surfaces as well as on hydrophilic surfaces, because the sunken geometry of the areas for assembly allows convection to drive nanoelements into those areas, to become entrapped, and to bind to the substrate surface, e.g., by van der Waals forces, even on relatively hydrophobic surfaces, or without a difference in hydrophilicity/hydrophobicity between the sunken areas and the higher areas. Therefore, the contact angle of both sunken and higher areas can be from 0° to about 130°, or from 0° to about 110°, or from 0° to about 100°, or from about 0° to about 90°, or from about 0° to about 80°.

Figure 1B:
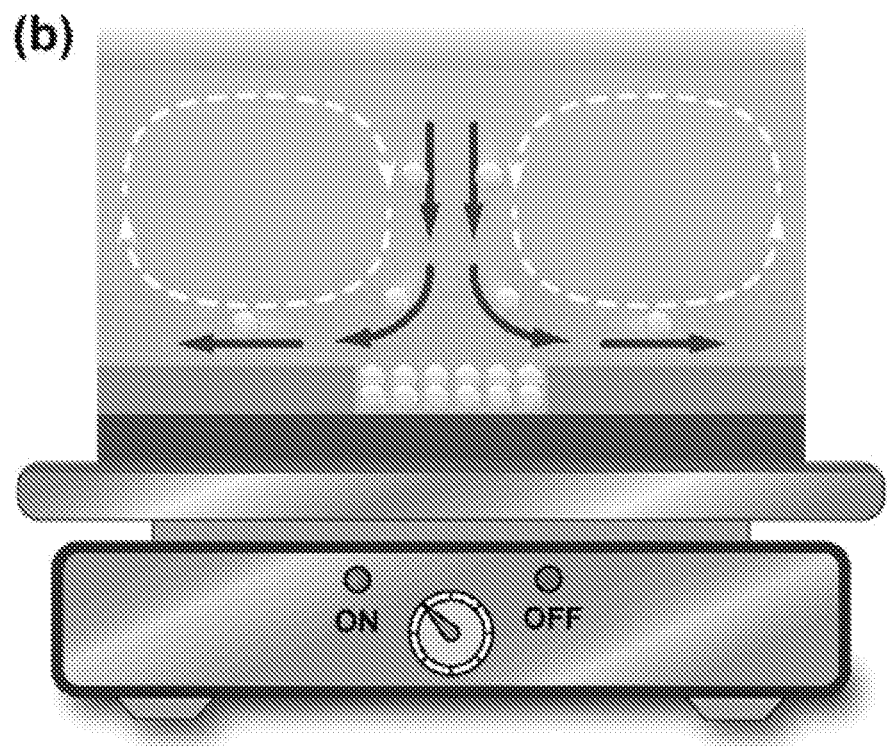
Figure 1C:
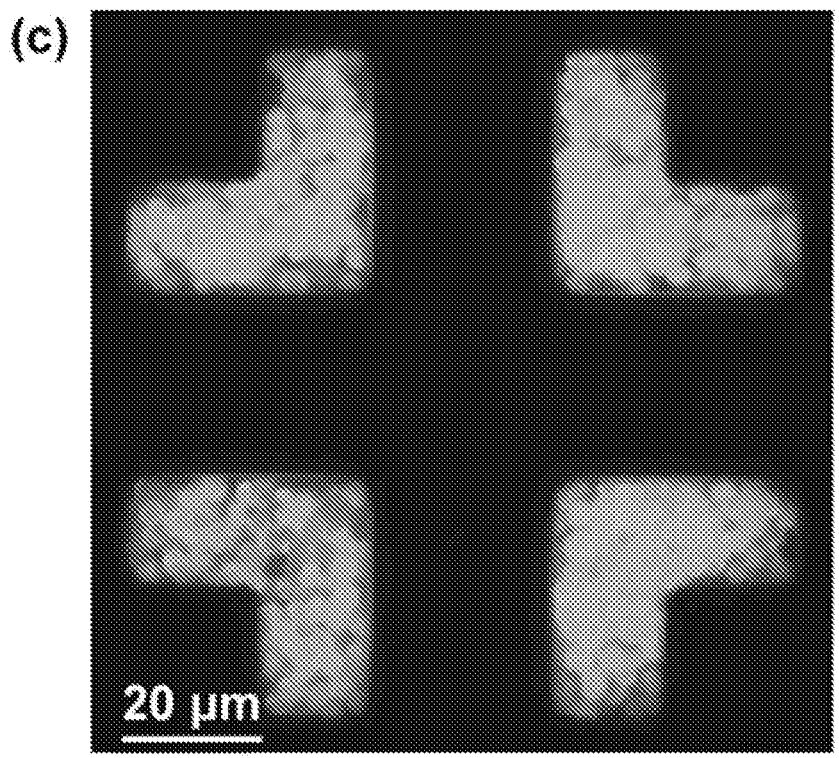
FIG. 1C shows a fluorescence microscopy image of 3 μm fluorescent silica particles assembled into microscale patterns.

As an example of the interfacial convective assembly, a patterned substrate optionally can be initially sonicated in isopropanol (IPA) (other water-miscible solvents, solvent mixtures, or solvent-water mixtures can be used) using a bath type sonicator, or other sonicator, for a few seconds. With a low surface tension, IPA helps wet as well as remove trapped air in the patterned structures. After sonication, the substrate is removed from the IPA bath, leaving a thin IPA film on the substrate. Afterwards, 50 μL aqueous particle suspension is drop cast on the IPA film. The particle suspension immediately mixes with the IPA film, resulting a suspension with about 20 wt % IPA. Then, the suspension is covered, for example by adding a cover over a spacer which creates a sealed, enclosed space on the substrate. This can be achieved, for example, with a glass slide placed upon a spacer (e.g., 100 μm, 200 μm, 300 μm, 400 μm, 500 μm, 700 μm, or 1 mm thick), creating a confined environment on top of the substrate. An example of such an interfacial convective assembly device is depicted in FIG. 1A. Finally, the setup is placed onto a heated surface (e.g., a hot plate or any substantially planar substrate, or a heated surface that conforms to the shape of the substrate) preheated to a temperature in the range from about 40° C. to about 75° C. The substrate is thereby heated, inducing convective flow as illustrated in FIG. 1B. Due to the convective flow, particles are carried towards the patterned substrate and then trapped in the pattern areas via van der Waals interactions as well as geometrical confinement (FIG. 1B and FIG. 1C). At the end of the assembly process, the substrate can be tilted perpendicular to the ground to remove excess particles from the non-patterned hydrophobic surface through Stokes drag exerted by the liquid meniscus at the three-phase contact line.

Nanoelements for use in the present technology can have any shape but have one or more dimensions in the range from about 1 nanometer to about 1000 nanometers, preferably from about 1 nanometer to about 100 nanometers; they may, however, have one or in some embodiments two dimensions larger than 1000 nm, or larger than 100 nanometers. Nanoelements include, for example, nanoparticles, nanotubes (including single-walled carbon nanotubes and multi-walled carbon nanotubes), nanofibers, nanocrystals, two dimensional materials including graphene, and quantum dots. Nanoparticles for use in the present technology can have any shape, but have all dimensions of about 1000 nanometers or less, or all dimensions of about 100 nanometers or less. Nanoparticles can be, for example, gold nanoparticles, silver nanoparticles, iron nanoparticles, carbon nanoparticles, silica nanoparticles, titania nanoparticles, alumina nanoparticles, or polystyrene or polystyrene-latex nanoparticles.

Nanoelements can include, for example, inorganic materials, metals and metal alloys, organic materials, conducting materials, semiconducting materials, insulating materials, naturally occurring materials, amorphous materials, crystalline materials, glassy materials, layered materials (including core-shell nanoparticles), polymeric materials (including nanoparticles formed from organic polymers), coated or partially coated materials, magnetic materials, functionalized materials, or a combination thereof. Nanoparticles or other nanoelements can include layers or shells in addition to a core material. Nanoparticles or other nanoelements can contain, for example, aluminum, boron, cadmium, calcium, carbon, cerium, cobalt, copper, fluorine, gallium, gold, indium, iron, manganese, molybdenum, oxygen, palladium, phosphorous, platinum, polymers, organic molecules, potassium, rhodium, selenium, silicon, sodium, strontium, tellurium, titanium, tungsten, zinc, zirconium, iron oxide or magnetite, aluminum oxide, cerium oxide, silicon dioxide, titanium oxide, zinc oxide, and combinations thereof.

The technology can be applied to patterned features or to channels having aspect ratios of, for example, about 10 or more, where aspect ratio is defined to be the ratio of height to width of the channel or the ratio of height to the cross-sectional width of the hole, well, channel, or via. The technology is not limited to aspect ratios of this dimension and also includes applications where the aspect ratio is about 0.5 or more, about 1 or more, about 2 or more, about 5 or more, about 50 or more, about 75 or more, or about 100 or more. The ratio of the dimension of the colloidal particle to the width of the feature or channel is considered, and the methods provide flexibility here. In order for the methods to provide deposition of the colloidal particle within the channel, the ratio of the channel width to particle size must be at least one, preferably greater than about 2, more preferably greater than about 5, more preferably greater than about 10, more preferably greater than about 20, and still more preferably greater than about 50.

Figure 4A:
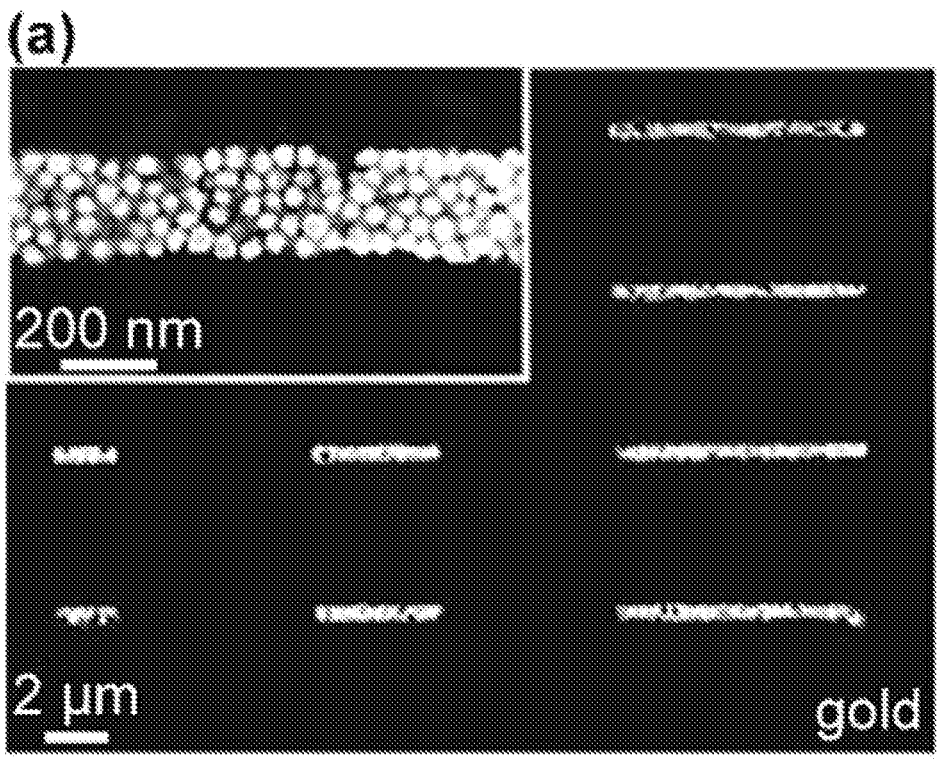
FIGS. 4A-4I show scanning electron microscopy (SEM) results depicting assembly of the indicated nanoparticles into patterned PMMA on silicon substrates.
Figure 4B:
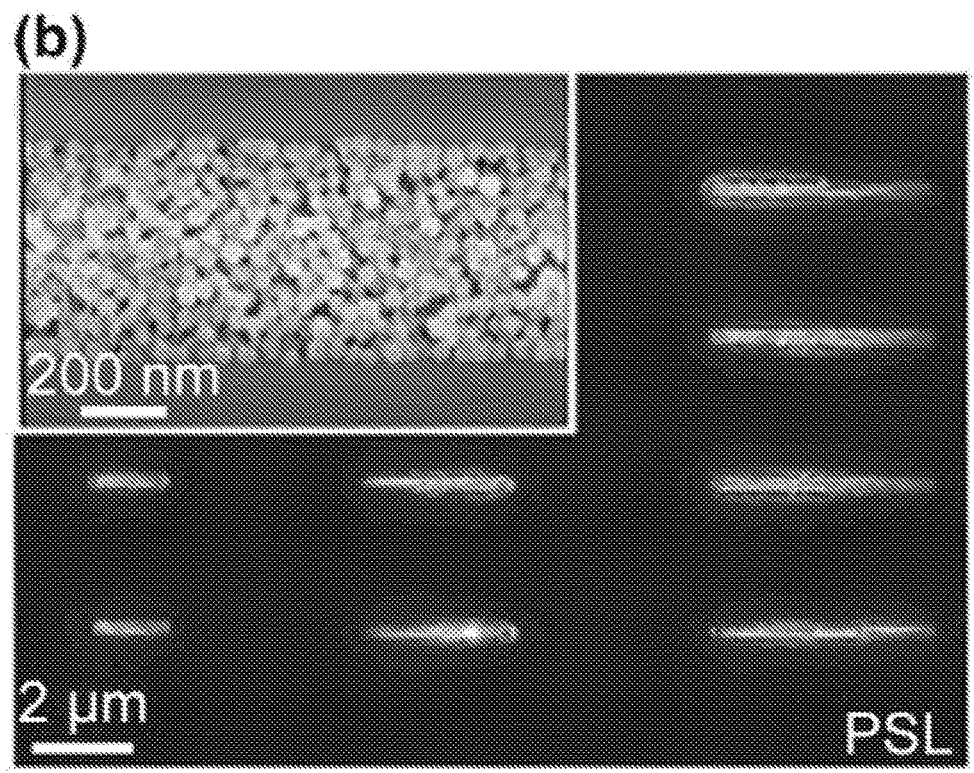
Figure 4C:
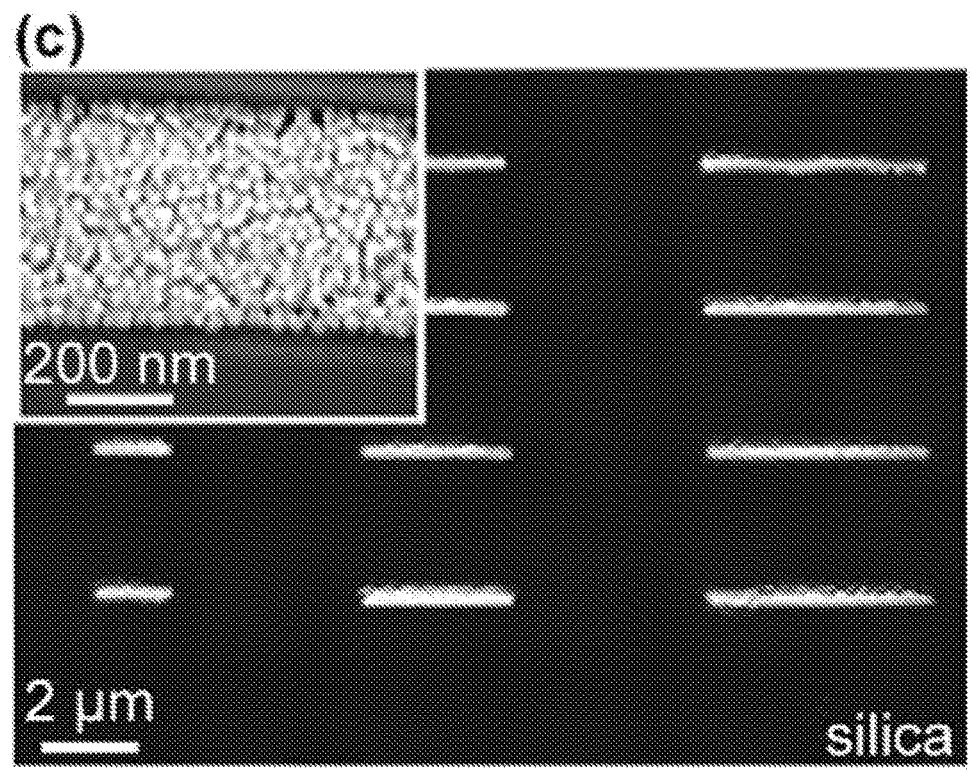
Figure 4D:
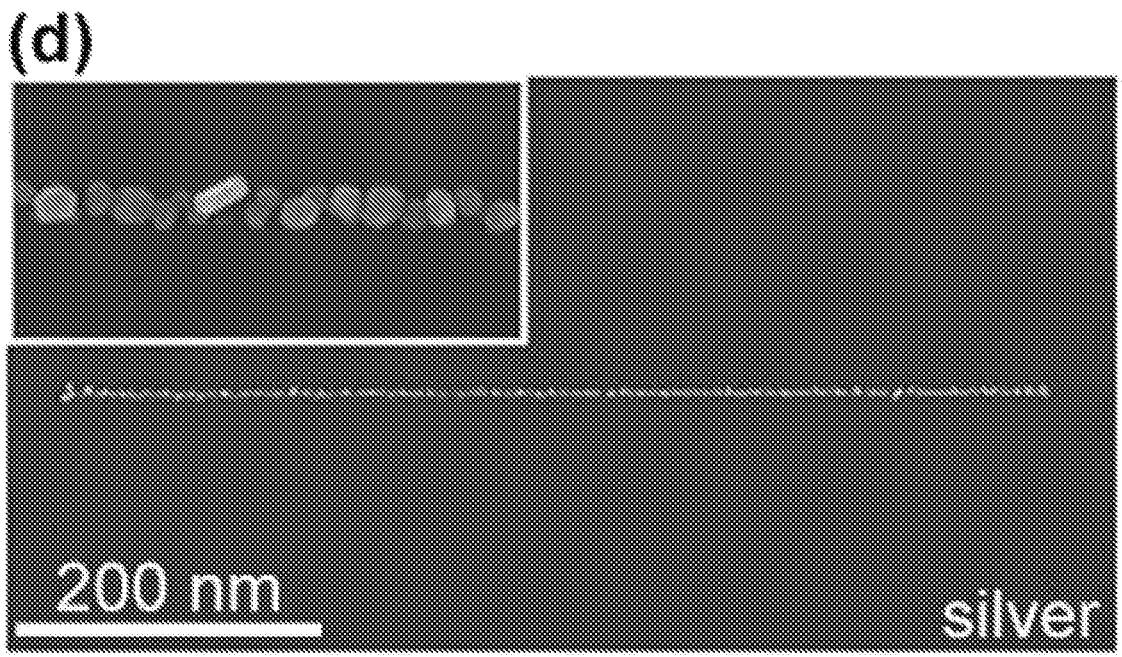

The present technology provides a versatile, scalable and high throughput interfacial convective assembly process which uses substrate heating-induced solutal Marangoni convective flow to direct particles towards patterned substrates and then uses van der Waals interactions and geometrical confinement to trap the particles into the pattern areas. Experiments and calculations have demonstrated that mixing aqueous particle suspensions with a solvent with high volatility and low surface tension is crucial for the formation of the solutal Marangoni flow and therefore for the success of the assembly process. Besides the properties of the solvent, it is also demonstrated that increasing the substrate temperature, particle concentration and assembly time can lead to increased assembly yield. The understanding and consequent control of the assembly parameters enables successful assembly of various nanoparticles (e.g., gold, PSL, silica, and silver) in patterns of different shapes (trenches, S-shaped trenches, diamonds, and vias) with a high resolution down to 25 nm or less (FIG. 4D). During the assembly process, the velocity of the solutal Marangoni convective flow is in the meters per second scale. The high-velocity flow drives particles to circulate rapidly in the suspension, enabling the particles get assembled in the patterns within a few minutes (two orders of magnitude faster than the conventional convective assembly). The high-velocity flow also enhances collision and coalescence of nanoparticles, causing self-annealing of small sized (below 5 nm) nanoparticles and consequent formation of solid nanowire and nanorod structures. The fabricated silver nanorod shows single crystal structure with a low resistivity of $8.58 \times 10^{-5}$ Ω cm. High versatility, high resolution, high throughput and high scalability make the interfacial convective assembly suitable for fabricating next-generation electronics and sensors.

Figure 2A:
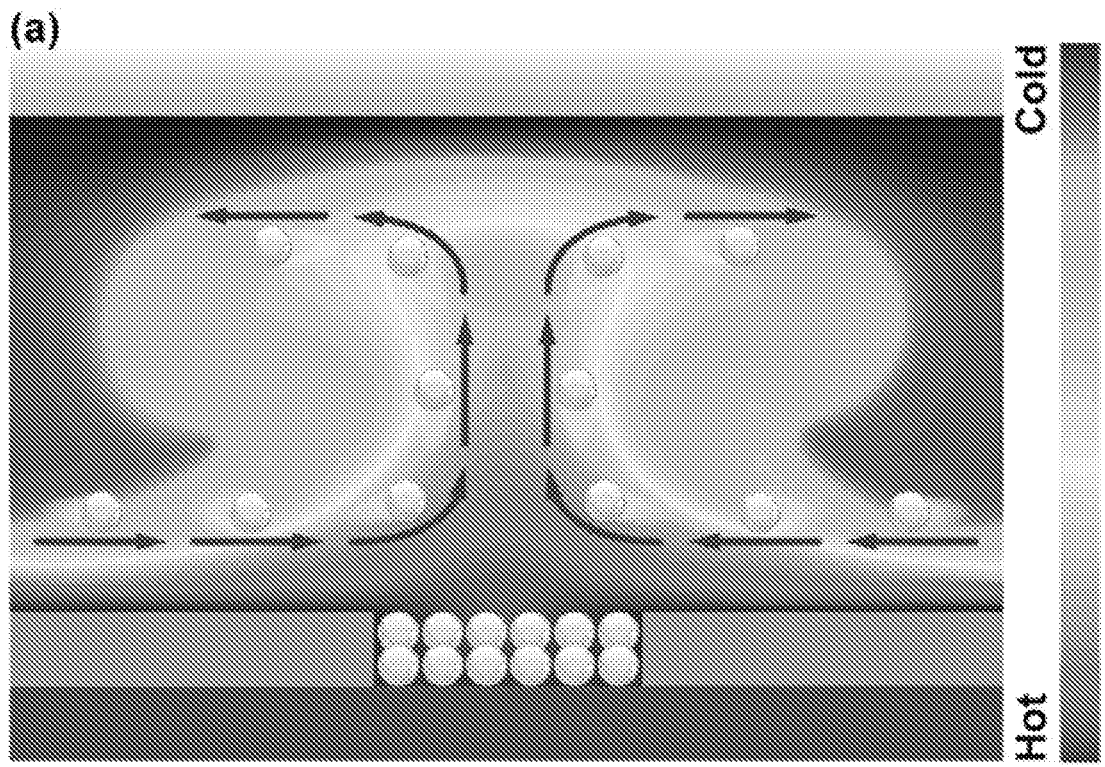
FIG. 2A shows a schematic illustration of substrate heating-induced Rayleigh-Benard and thermal Marangoni convective flows which drive a suspension to flow away from a patterned substrate.
Figure 2B:
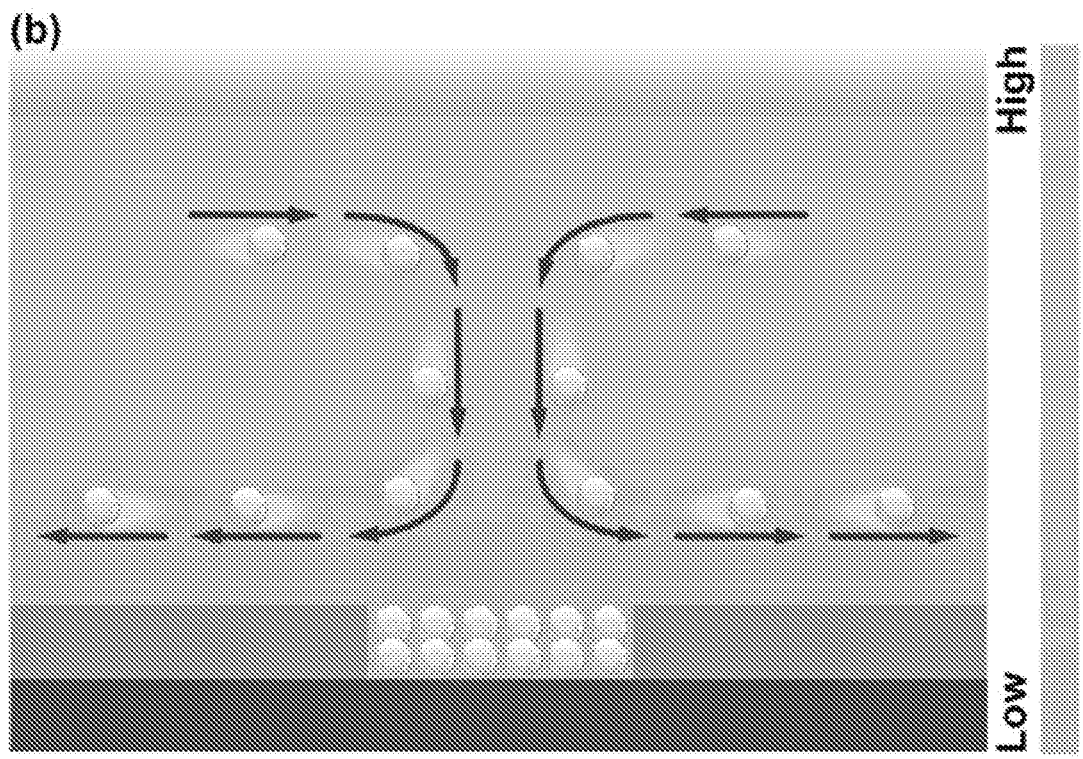
FIG. 2B shows a schematic illustration of substrate heating-induced solutal Marangoni convective flow which drives a suspension to flow towards the patterned substrate. Low and high stand for low and high solvent concentration.
Figure 2C:
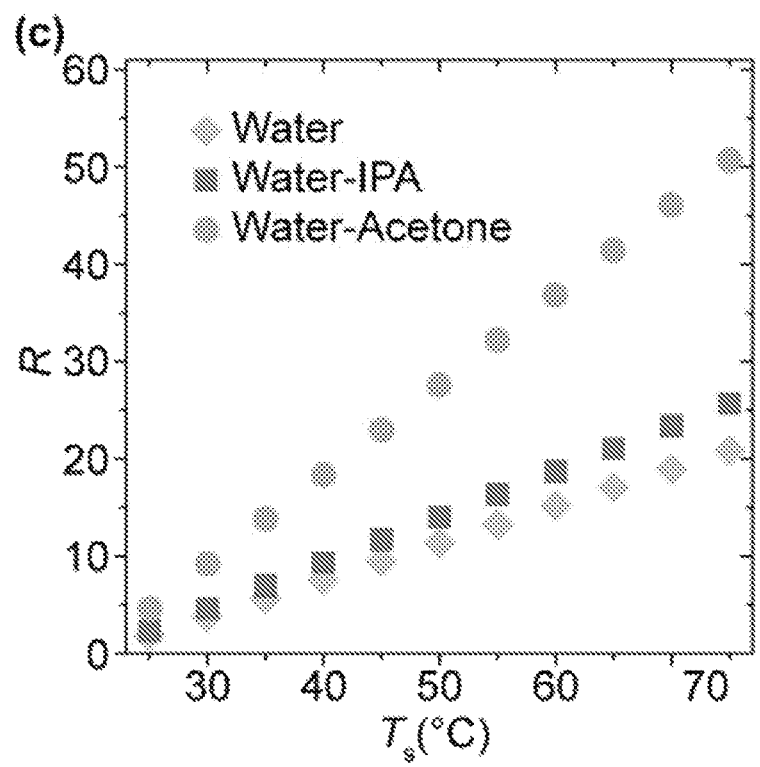
FIG. 2C shows a plot of Rayleigh number (R) as a function of the substrate temperature ($T_s$).

The inventors considered whether, during the interfacial convective assembly, Rayleigh-Benard convection, thermal Marangoni convection, and solutal Marangoni convection were happening. Rayleigh-Benard convection is caused by substrate heating-induced density gradient across the suspension layer (de Bruyn, et al., 2002). The density gradient drives lighter suspension at the bottom upwards by buoyancy force and heavier suspension at the top downwards by gravity force. An example is depicted in FIG. 2A. However, it has been reported that Rayleigh-Benard convection is negligible in micrometer length scale (Chen, et al., 2019; Gargiulo, et al., 2017; Winterer, et al., 2018). To verify the existence of the Rayleigh-Benard convection, a dimensionless number, Rayleigh number (R), is calculated as:

$$R = \frac{\rho_m g \alpha_m \Delta T h^3}{\eta_m \kappa_m} \quad \text{(Eq. 1)}$$

where g is the acceleration due to gravity, $\rho_m$, $\alpha_m$, $\eta_m$ and $\kappa_m$ are the density, thermal volume expansion coefficient, dynamic viscosity, and thermal diffusivity of the mixed suspension, respectively, $\Delta T$ is the vertical temperature difference between the bottom (substrate temperature, $T_s$) and the top (room temperature, about 20° C.) of the suspension, and h is the thickness of the suspension. The thermal diffusivity $\kappa_m$ can be obtained as:

$$\kappa_m = \frac{\lambda_m}{\rho_m C p_m} \quad \text{(Eq. 2)}$$

where $\lambda_m$ and $Cp_m$ are the thermal conductivity and heat capacity of the mixed suspension. Using the parameters listed in Table 1, Rayleigh numbers at different substrate temperatures are calculated. The example shown in FIG. 2C presents Rayleigh numbers (R) as a function of the substrate temperature ($T_s$). A higher substrate temperature results in a larger Rayleigh number and a stronger Rayleigh-Benard convective flow. However, even at the higher substrate temperature of 75° C., the calculated Rayleigh number is much smaller than the critical value ($R_c$) of 1708, (Cross, et al., 1993), which means that the Rayleigh-Benard convection does not significantly occur.

TABLE 1

Physical properties of the suspensions

|  | Water-based suspension | Water-IPA (20 wt %) mixed suspension | Water-acetone (20 wt %) mixed suspension |
|---|---|---|---|
| Density $\rho$ (kg/m³) | 998.4 | 969.1 | 972.8 |

TABLE 1-continued

Physical properties of the suspensions

|  | Water-based suspension | Water-IPA (20 wt %) mixed suspension | Water-acetone (20 wt %) mixed suspension |
|---|---|---|---|
| Thermal expansion coefficient $\alpha$ (° C.$^{-1}$) | $2.1 \times 10^{-4}$ | $6.0 \times 10^{-4}$ | $6.4 \times 10^{-4}$ |
| Dynamic viscosity $\eta$ (mPa s) | 1.00 | 2.54 | 1.43 |
| Thermal diffusivity $\kappa$ (m²/s) | $1.44 \times 10^{-7}$ | $1.29 \times 10^{-7}$ | $1.24 \times 10^{-7}$ |
| Thermal conductivity $\lambda$ (mW m$^{-1}$ K$^{-1}$) | 598.1 | 483.5 | 455.0 |
| Heat capacity Cp (J mol$^{-1}$ K$^{-1}$) | 74.9 | 80.8 | 78.5 |
| Diffusion coefficient $D_m$ (m²/s) | — | $1.1 \times 10^{-9}$ | $1.1 \times 10^{-9}$ |

Figure 2D:
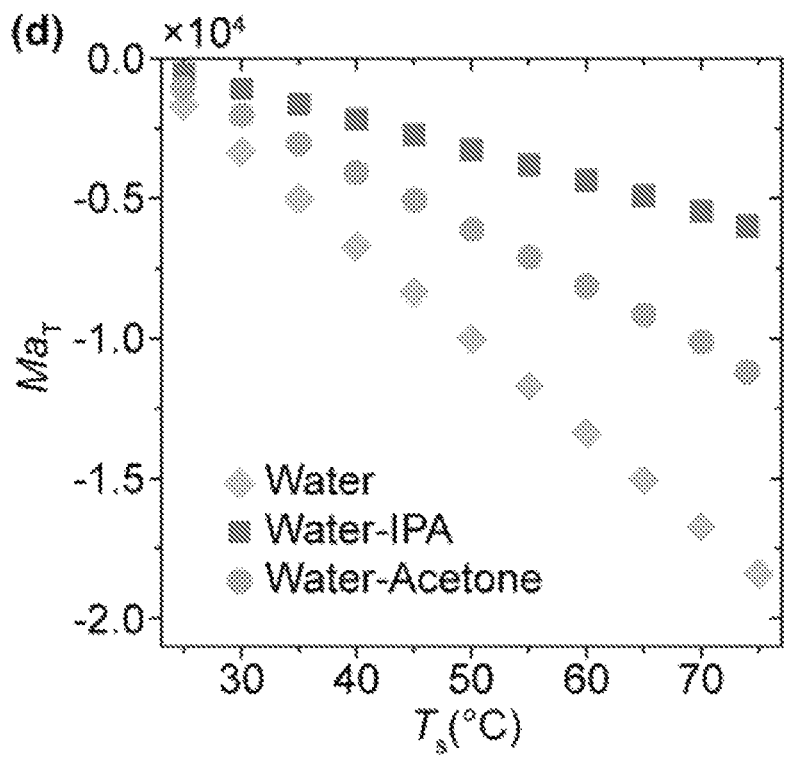
FIG. 2D shows a plot of thermal Marangoni number ($Ma_T$) as a function of $T_s$.

Thermal Marangoni convection (Namura, et al., 2018; Hu, et al., 2018) originates from heating-induced surface tension gradient. The surface tension gradient drives hot suspension with a low surface tension close to the substrate to flow towards the cold region with a high surface tension (FIG. 2A). The thermal Marangoni convection is reported to be prominent in micrometer length scale (Gargiulo, et al., 2017). To validate this conclusion, another dimensionless number, thermal Marangoni number ($Ma_T$), is calculated as:

$$Ma_T = \frac{\partial \gamma_m}{\partial T} \Delta T \frac{h}{\eta_m \kappa_m} \quad \text{(Eq. 3)}$$

where $\gamma_m$ is the surface tension of the mixed suspension (Vazquez, et al., 1995; Enders, et al., 2007). The thermal Marangoni number also increases with the substrate temperature and ranges between 540 and 6000 (FIG. 2D). Even at the lowest substrate temperature of 25° C. ($\Delta T$ of 5° C. compared to a room temperature of 20° C.), the thermal Marangoni number is larger than the critical Marangoni number ($Ma_c$) of 80, (Cross, et al., 1993), demonstrating that thermal Marangoni convection can occur and is thus a candidate for driving particle assembly.

Figure 2E:
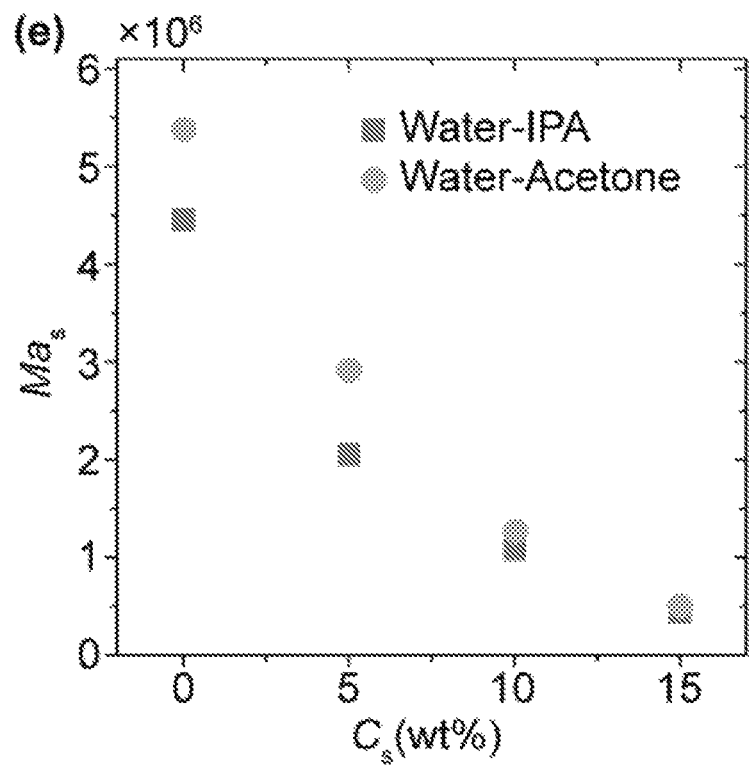
FIG. 2E shows a plot of solutal Marangoni number ($Ma_s$) as a function of the solvent concentration.

Solutal Marangoni convection (Namura, et al., 2018; Hu, et al., 2018) also originates from heating-induced surface tension gradient. The suspension used in the assembly contains two solvents: water (low volatility and high surface tension) and IPA (high volatility and low surface tension). When the substrate is heated, preferential evaporation of IPA induces concentration and surface tension gradient across the suspension: the suspension close to the substrate becomes water rich with a high surface tension and the suspension away from the substrate becomes IPA rich with a low surface tension. The surface tension gradient causes the solutal Marangoni flow, driving the bulk suspension towards the substrate where the surface tension of the suspension is high (FIG. 2B). To evaluate the strength of the solutal Marangoni flow, solutal Marangoni number ($Ma_s$) is calculated as:

$$Ma_s = -\frac{\partial \gamma_m}{\partial C_s} \Delta C_s \frac{h}{\eta_m D_m} \quad \text{(Eq. 4)}$$

where $\Delta C_s$ is the concentration difference, and $D_m$ is the diffusion coefficient of IPA in water and is given by:

$$D_m = \frac{7.4 \times 10^{-12} \times (\phi M_w)^{0.5} T}{\eta_w V_I^{0.6}} \quad \text{(Eq. 5)}$$

where $\phi$ is a dimensionless association factor equal to 2.6 for water, $M_w$ is the molecular weight of water (18 g/mol), T is the temperature in kelvin, $\eta_w$ is the viscosity of water (1.00 mPa s), and $V_I$ is the molar volume of IPA (76.5 mL/mol) at its normal boiling temperature. Assuming different IPA concentrations close to the substrate, a series of solutal Marangoni numbers are calculated (FIG. 2E). A lower IPA concentration around the substrate generates a larger concentration gradient, causing a larger solutal Marangoni number and thus a stronger solutal Marangoni flow. The calculated solutal Marangoni numbers are also much higher than the critical Marangoni number ($Ma_c$) of 80, (Cross, et al., 1993), indicating that solutal Marangoni convection could be another force to drive particle assembly.

As discussed above, the thermal and the solutal Marangoni convective flows are two possible forces to drive particle assembly. However, it is observed that the directions of the thermal and the solutal Marangoni flows are opposite: the thermal Marangoni convention flows away from the substrate, while the solutal Marangoni convection flows towards the substrate. The net flow of the suspension is a competition between the two Marangoni flows. Calculation results show that the solutal Marangoni number is at least two orders of magnitude larger than the thermal Marangoni number, meaning that the solutal Marangoni flow is dominant. The solutal Marangoni convection has a high flow velocity in the meter per second scale (Hyoungsoo, et al., 2017). The high-speed flow drives particles to circulate rapidly in the suspension, enabling the particles to be assembled in the pattern areas within a few minutes. It is worth noting that the speed of the interfacial convective assembly is two orders of magnitude higher than that of the conventional convective assembly (Malaquin, et al., 2007). In addition to the rapid solutal Marangoni convective flow, another reason for the high assembly speed is that assembly takes place over the entire substrate at the same time instead of at the three-phase contact line for the case of the conventional convective assembly.

Figure 7A:
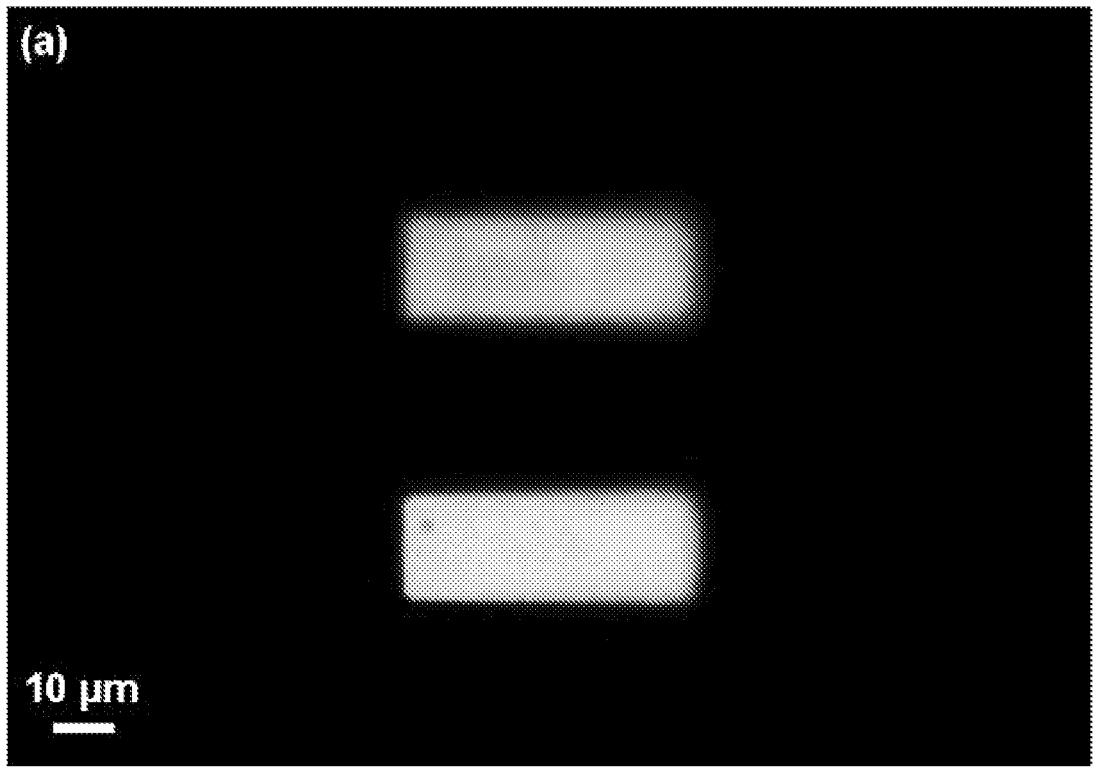
FIGS. 7A-7B show assembly of 1 µm fluorescent silica particles in 20 µm wide trenches using (FIG. 7A) water-IPA mixed and (FIG. 7B) water only suspensions.
Figure 7B:
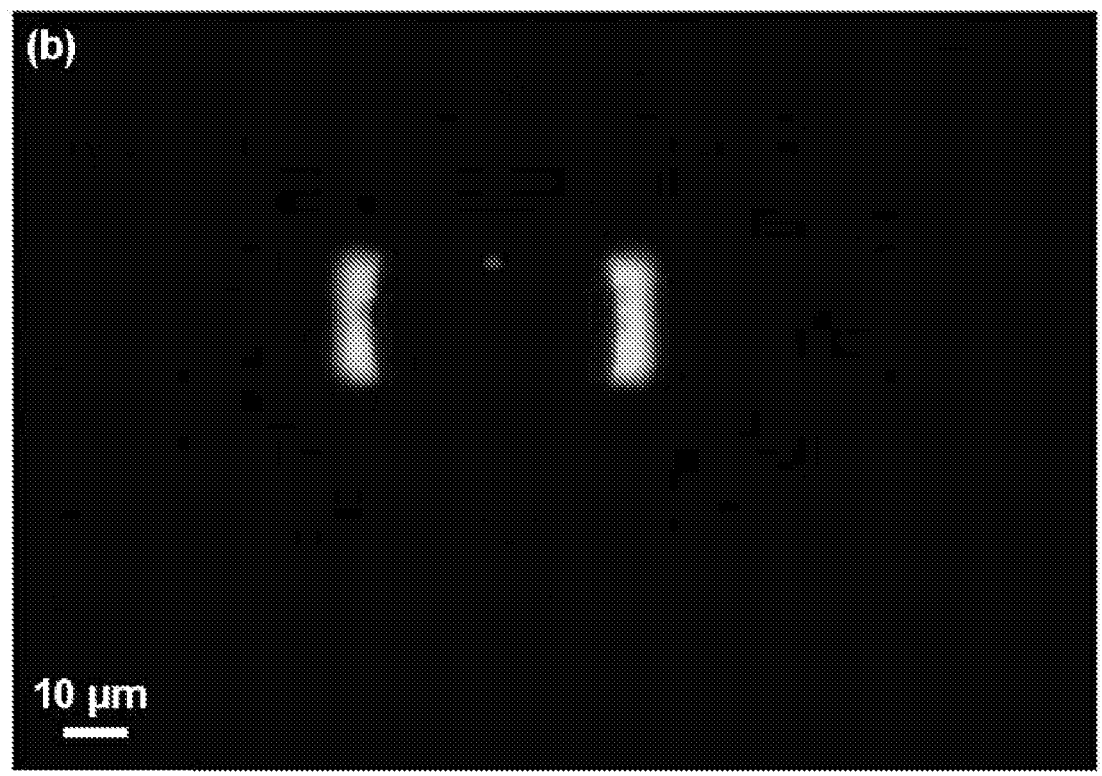
Figure 8A:
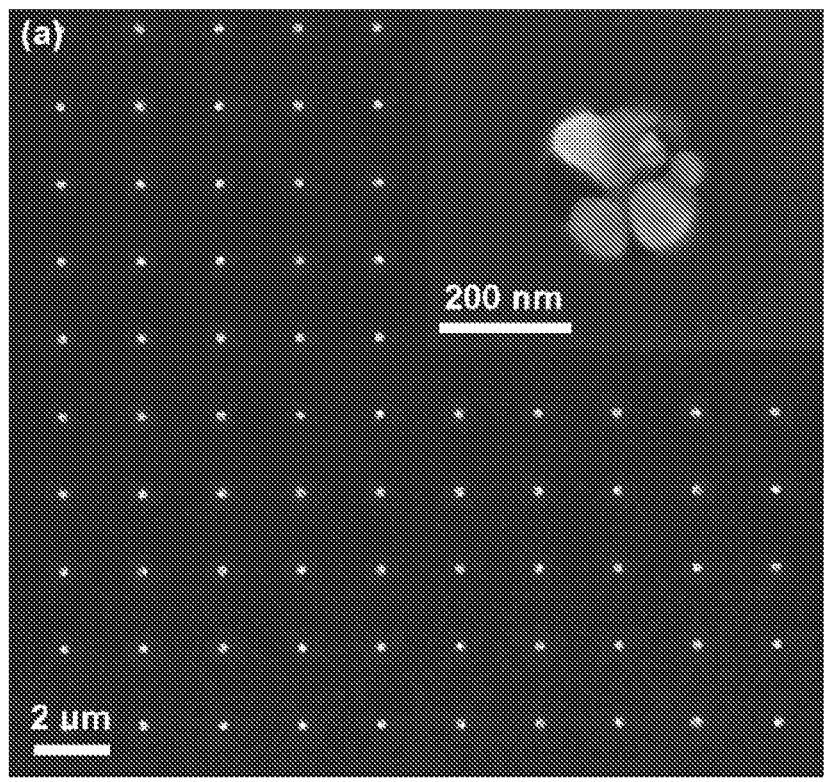
FIGS. 8A-8B show SEM images of assembly of 5 nm silver nanoparticles in an array of 200 nm vias with a spacing of 2 µm using (FIG. 8A) non-premixed and (FIG. 8B) premixed suspensions.
Figure 8B:
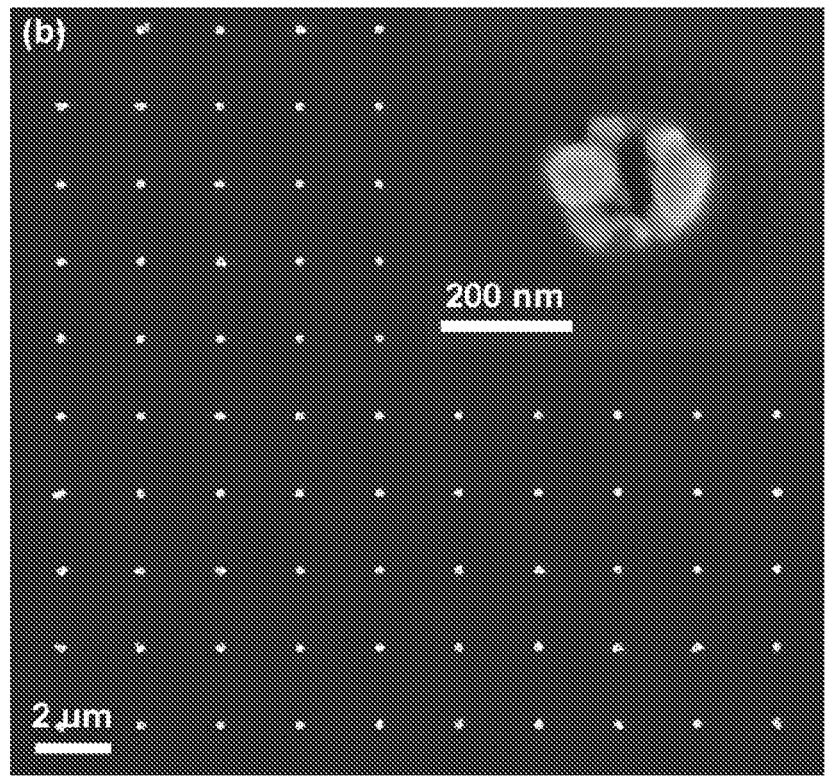
Figure 9A:
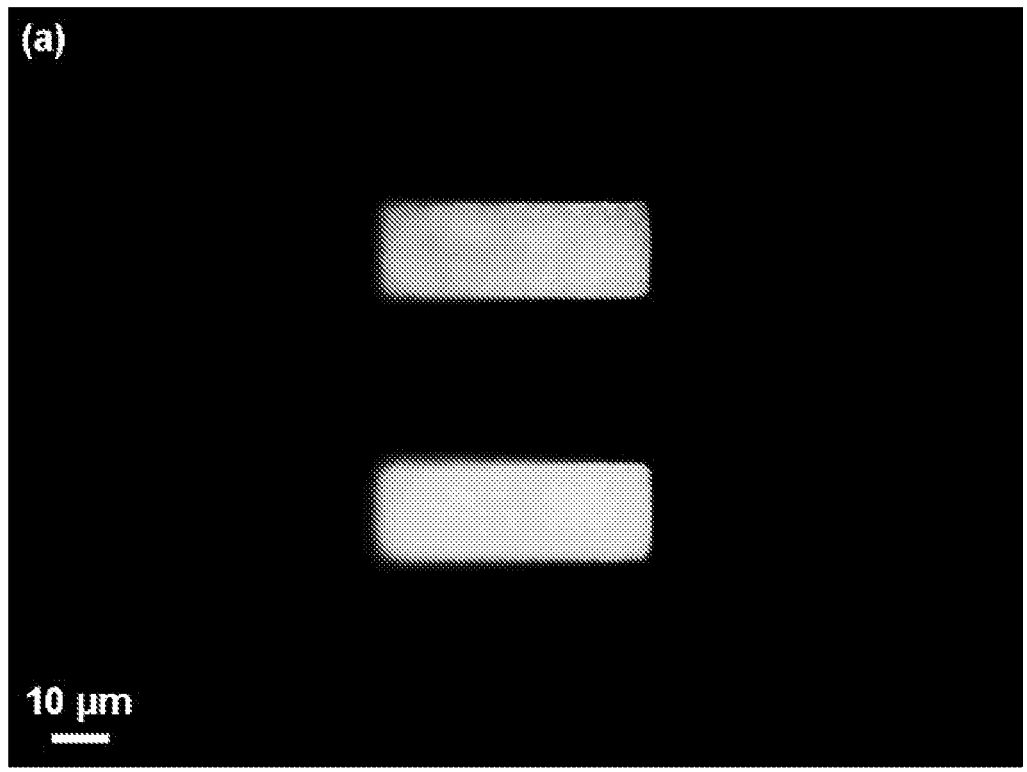
FIGS. 9A-9B show assembly of 1 µm fluorescent silica particles in 20 µm wide trenches using water-IPA (FIG. 9A) and water-acetone (FIG. 9B) mixed suspensions.
Figure 9B:
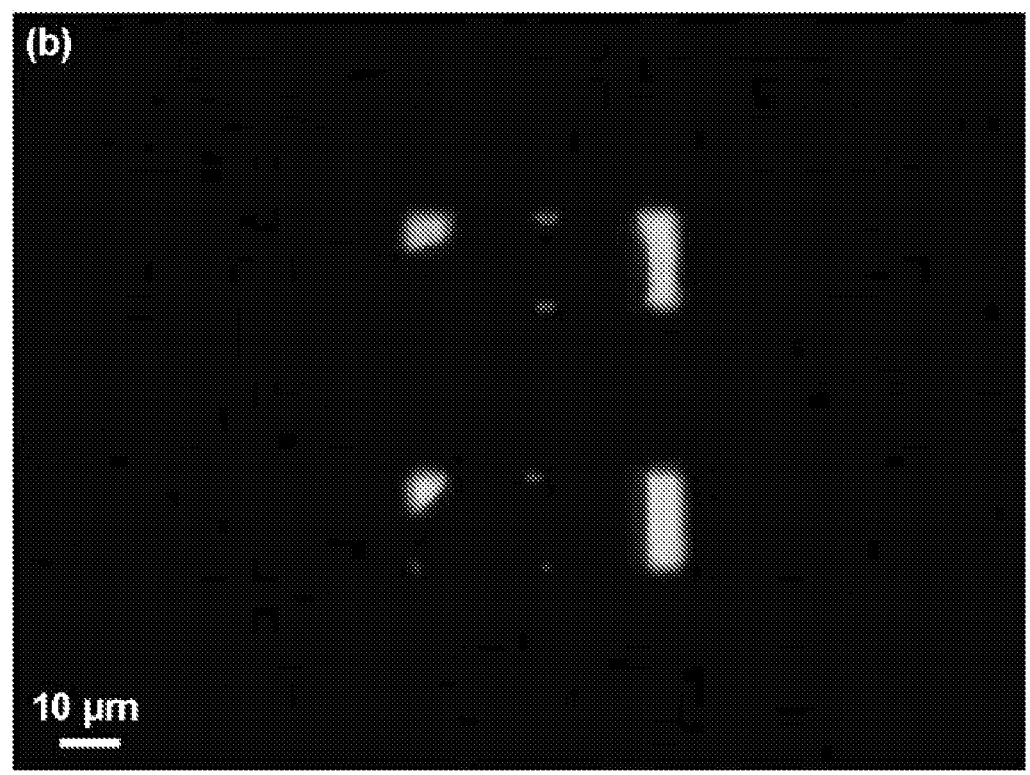
Figure 10A:
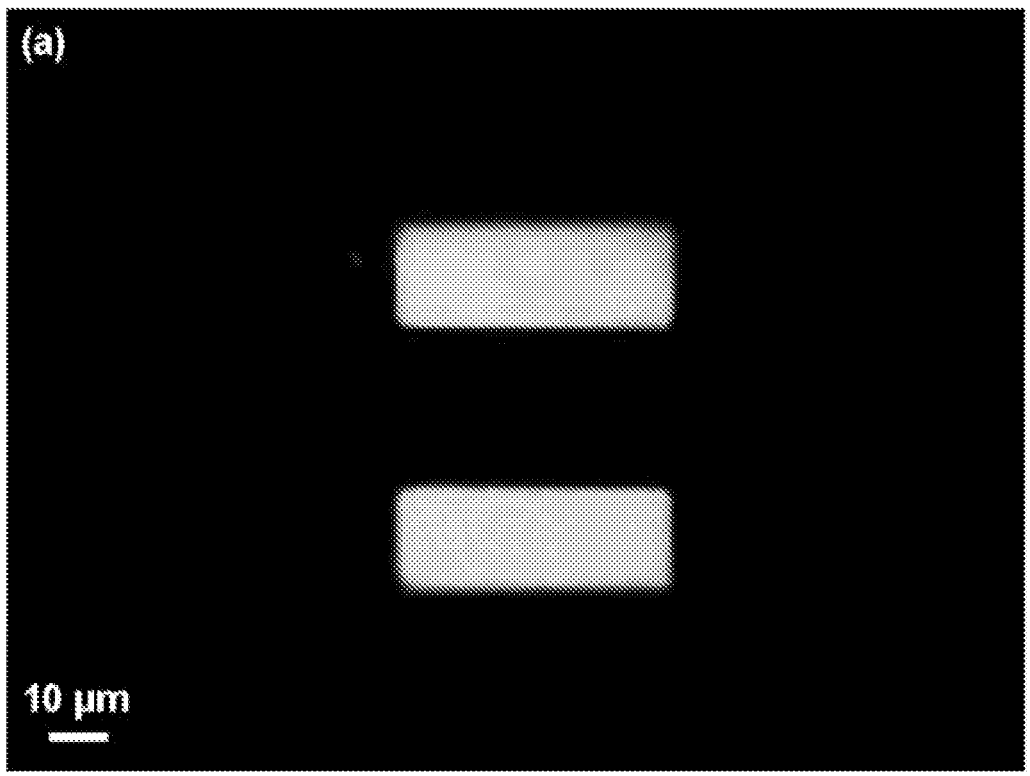
FIGS. 10A-10B show assembly of 1 µm fluorescent silica particles in 20 µm wide trenches using (FIG. 10A) water-IPA mixed and (FIG. 10B) water-chloroform immiscible suspensions.
Figure 10B:
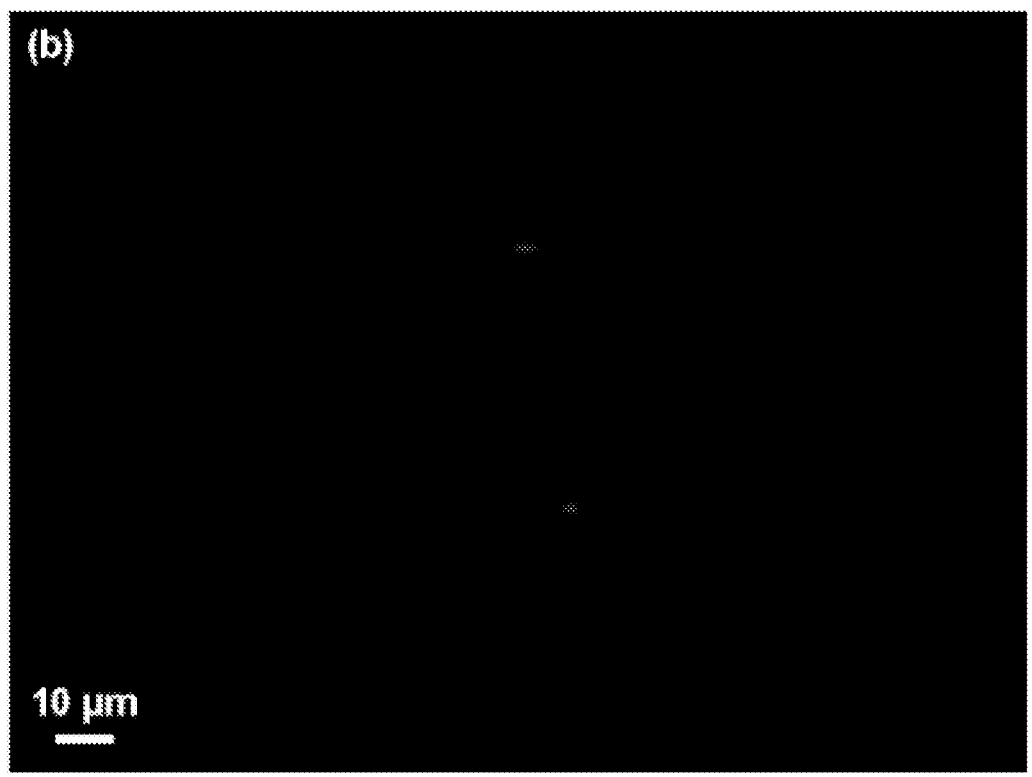

From the above discussion, it is concluded that the solutal Marangoni convective flow is the dominant force driving particles in the interfacial convective assembly. A binary solvent suspension with one component having a high volatility and a low surface tension is a necessity to generate the solutal Marangoni convective flow. In order to validate this, a comparison assembly that eliminates the solutal Marangoni flow by using a water only suspension is conducted. Based on the calculated results (FIG. 2C, FIG. 2D, FIG. 2E), the thermal Marangoni convective flow is the only driving force in the case of water only suspension. With the same assembly parameters, while full assembly is realized when water-IPA mixed suspension is used (FIG. 7A), only ~12.5% of the pattern is filled when water only suspension is used (FIG. 7B), demonstrating that the solutal Marangoni convection is superior to the thermal Marangoni convection in the view of driving particles. In the assembly process, mixing of IPA and the particle suspension can also cause a solutal Marangoni flow. However, because the mixing happens in only a few seconds, the contribution of the mixing-induced Marangoni flow to the assembly is negligible (Example 2). FIG. 8A shows assembly of 5 nm silver nanoparticles in an array of 200 nm vias with a spacing of 2 um using non-premixed suspensions. FIG. 8B shows assembly of 5 nm silver nanoparticles in an array of 200 nm vias with a spacing of 2 um using premixed suspensions. Besides water-IPA mixed suspension, another binary solvent (water and acetone) suspension is also investigated. Because of the high volatility and low surface tension nature of acetone, a solutal Marangoni-dominated convective flow is supposed to be generated and the flow should be even stronger than that in the case of the water-IPA mixed suspension based on calculations (FIG. 2E). However, only ~15% assembly is observed when water-acetone mixed suspension is used (FIG. 9B). The reason for the low assembly efficiency is that acetone is too volatile and evaporates too fast. During the assembly process, very little acetone is left on the substrate before drop casting the particle suspension. When that acetone is evaporated, the solutal Marangoni flow ceases and consequently slows down the assembly process. This view is supported by the very close assembly efficiency of water only suspension (12.5%, FIG. 7B) and water-acetone mixed suspension (15%, FIG. 9B). In addition to IPA and acetone, chloroform is also used for conducting the assembly. Even though chloroform is highly volatile and has a low surface tension, almost no assembly is obtained (FIG. 10B) because of its low miscibility, Table 2, with water-based suspension.

TABLE 2

Physical properties of solvents used for the interfacial convective assembly

| | Water | IPA | Acetone | Chloroform |
|---|---|---|---|---|
| Density at 20° C. [g/cm³] | 0.998 | 0.785 | 0.790 | 1.480 |
| Surface tension at 20° C. [mN/m] | 72.75 | 21.74 | 23.68 | 27.10 |
| Viscosity at 20° C. [mPa s] | 1.002 | 2.414 | 0.320 | 0.564 |
| Boiling point [° C.] | 100 | 82.3 | 55.8 | 61.1 |
| Solubility in water at 20° C. [g/100 mL] | — | Fully miscible | Fully miscible | 0.8 |

If acetone is utilized, or another water-miscible solvent with a fast rate of evaporation or high vapor pressure that reduces the amount of solvent remaining when covered with an aqueous suspension of nanoelements, evaporation of the acetone or other solvent can be prevented, for example, by raising the surrounding vapor pressure of acetone before applying the particle suspension. Examples of other water-miscible solvents that can be utilized are acetaldehyde, acetic acid, acetone, acetonitrile, butanol, ethanol, ethylene glycol, 1-propanol, methanol, n-butyl acetate, pyridine, hydrazine, tetrahydrofuran, or a combination thereof.

To further understand the assembly kinetics, three other parameters, including the substrate temperature, the particle concentration (C) as well as the assembly time (1), were investigated. The particles used are 30 nm fluorescent silica nanoparticles with a concentration of 25 mg/mL, and the template used to guide assembly consists of twenty 200 nm wide and 10 µm long trenches patterned in a 500 nm thick poly(methyl methacrylate) (PMMA) film on a silicon substrate. The substrate temperature controls the assembly by affecting the strength of the Marangoni convective flow.

Figure 3A:
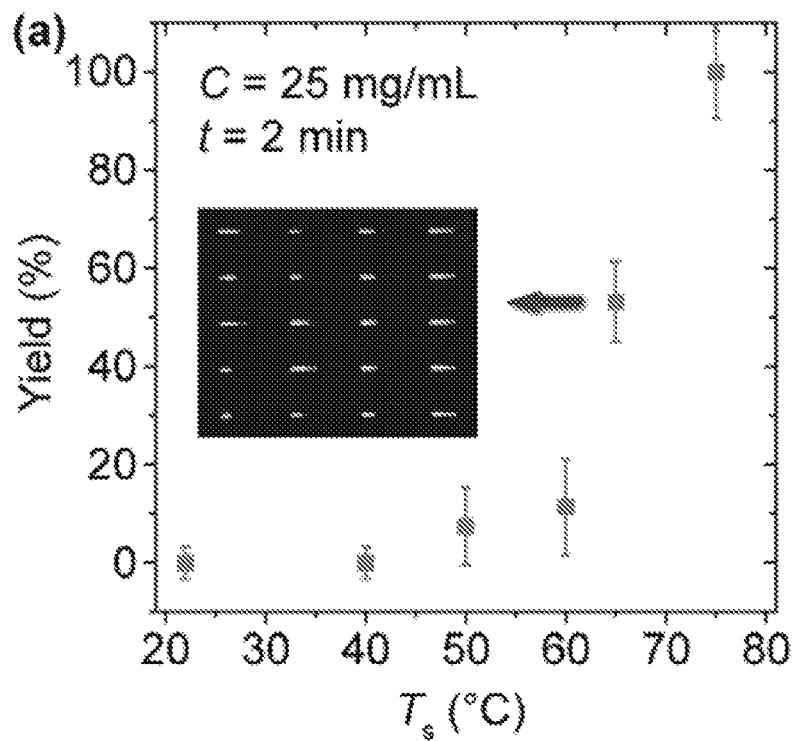
FIGS. 3A-3C show effects of three governing parameters on the interfacial convective assembly of fluorescent silica particles.
Figure 3B:
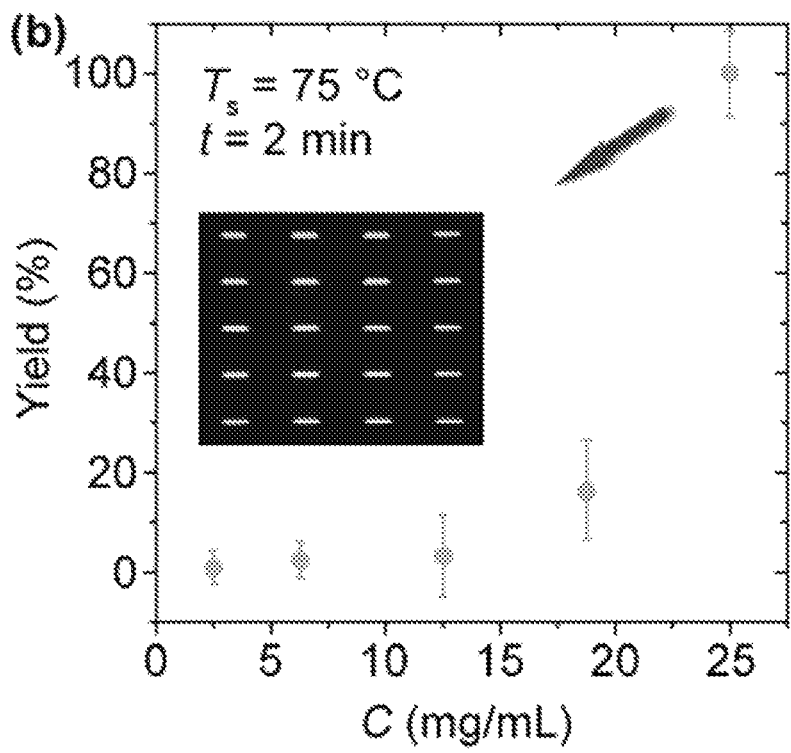
Figure 3C:
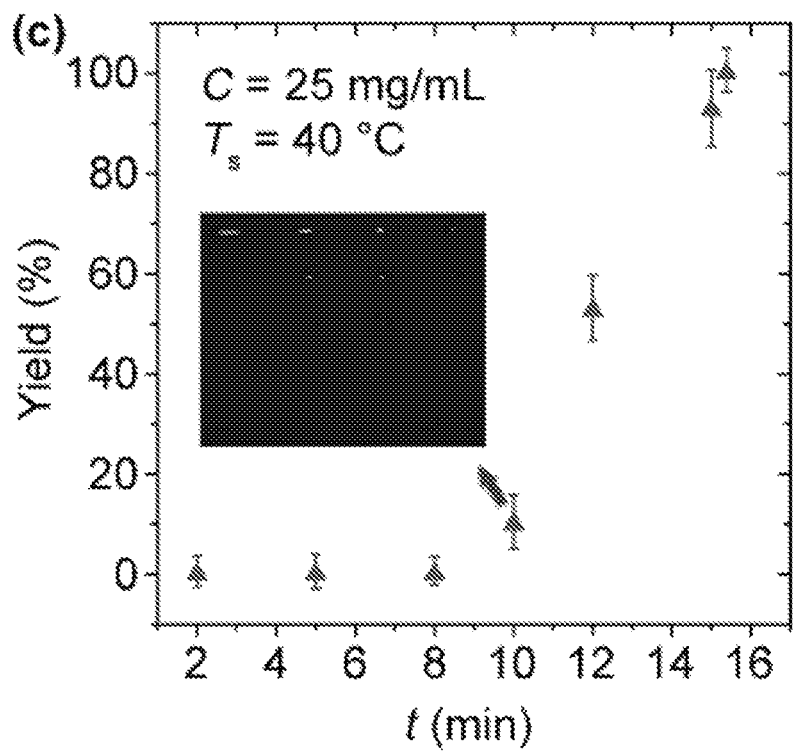

With the increase of the substrate temperature, the evaporation rate of IPA increases, which reduces the IPA concentration close to the substrate and enlarges the IPA concentration difference across the suspension. Consequently, a stronger solutal Marangoni convective flow is generated, resulting in a higher assembly yield (FIG. 3A). Compared with the substrate temperature, the influence of the particle concentration and the assembly time on the assembly yield is relatively straightforward. With the increase of the particle concentration and the assembly time, either more nanoparticles are carried towards the substrate by the convective flow or the time spent for particle accumulation is prolonged, resulting in increased assembly yield, as seen in FIG. 3B and in FIG. 3C.

Figure 4E:
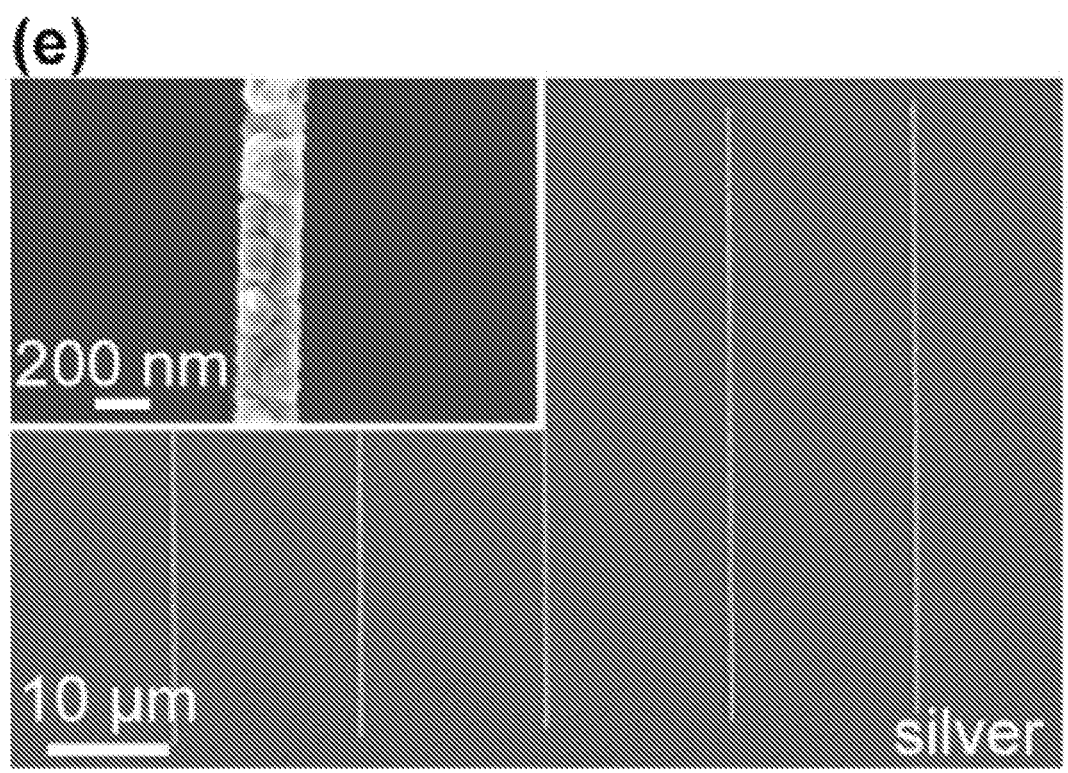
Figure 4F:
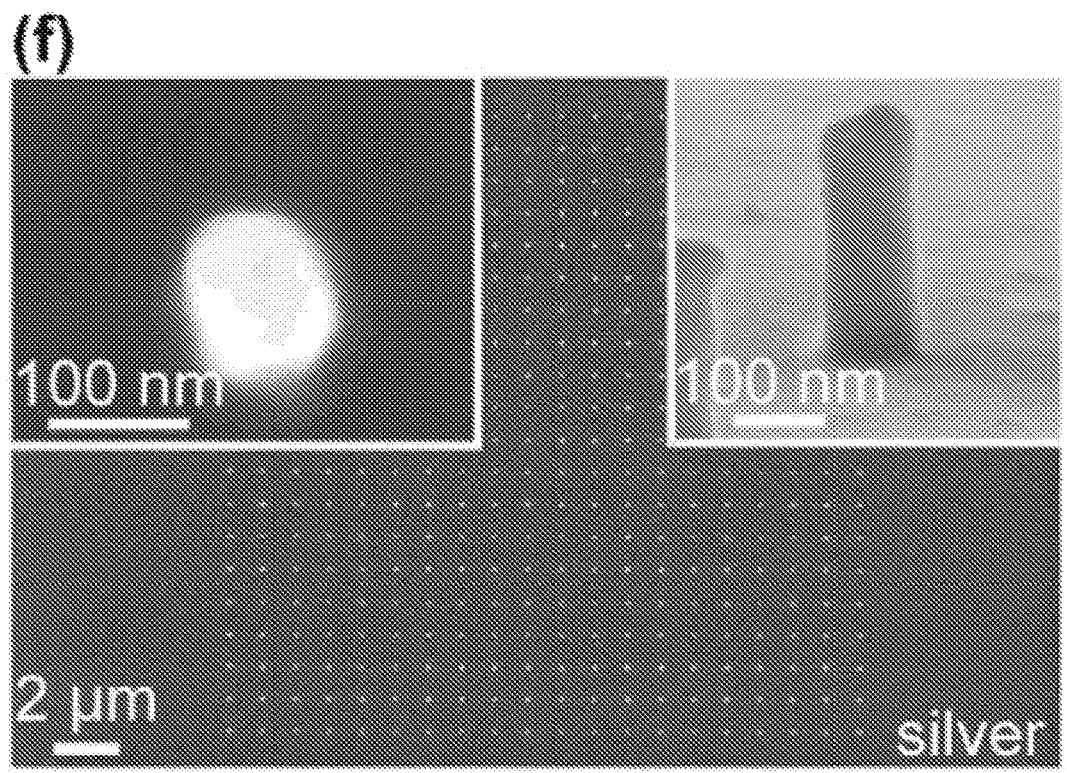
Figure 11A:
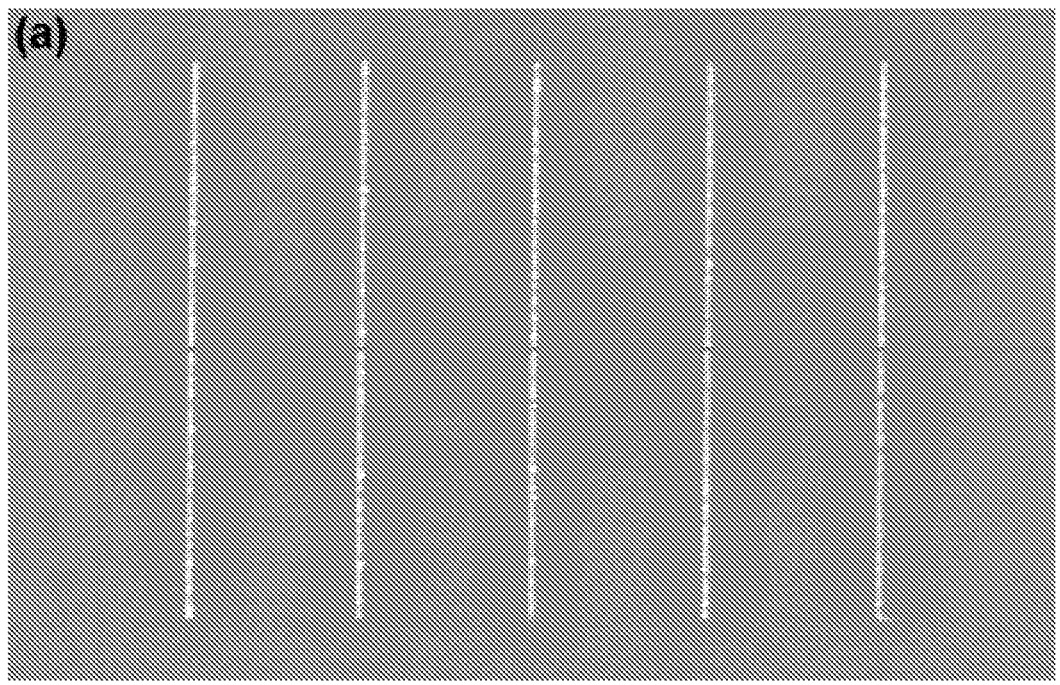
FIG. 11A shows an atomic force microscope (AFM) image of an assembled silver nanowire array.
Figure 11B:
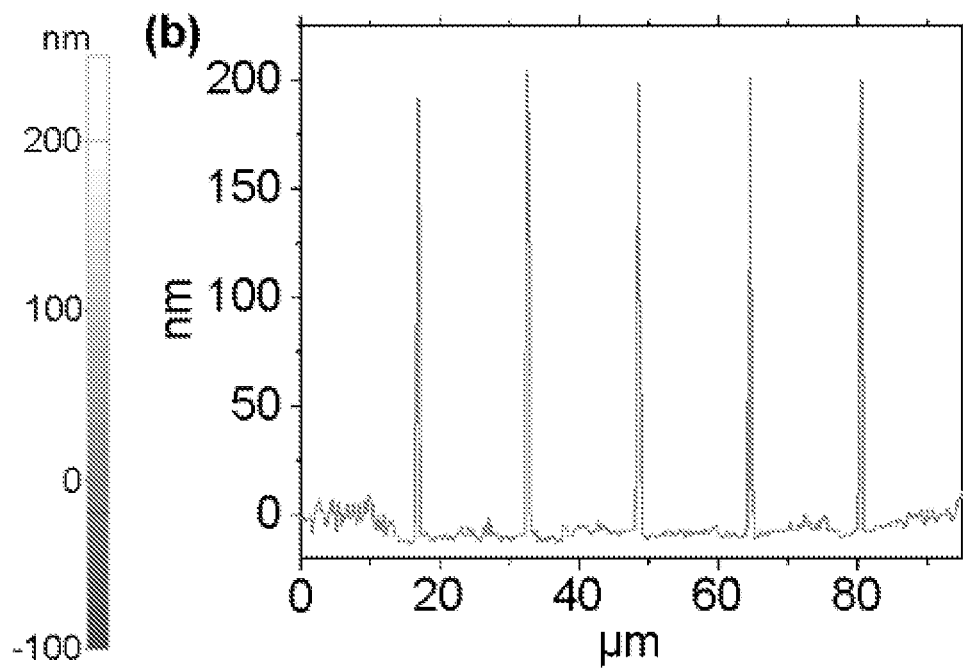
FIG. 11B shows a cross-sectional profile along the central line shown in FIG. 11A, from which the thickness of the silver nanowires was measured.

To demonstrate the versatility of the interfacial convective assembly, various nanoparticles such as gold, polystyrene latex (PSL), silica and silver with different diameters are assembled in patterned PMMA on silicon substrates, as shown in FIG. 4A, FIG. 4B, FIG. 4C, and FIG. 4D. Assembly with single particle resolution can be achieved when patterns with dimensions slightly larger than the nanoparticle diameter are used (FIG. 4D). More interestingly, when 5 nm silver nanoparticles are used during assembly, self-annealing and fusion of the assembled nanoparticles occurs in-situ, forming solid nanowire and nanorod structures, as shown in FIG. 4E and FIG. 4F. The fabricated silver nanowires show a uniform height of ~200 nm as shown in FIG. 11A and FIG. 11B. The self-annealing behavior may arise from collision and subsequent coalescence of the nanoparticles (Grammatikopoulos, et al., 2019; Mariscal, et al., 2005). As discussed above, the velocity of the solutal Marangoni convective flow is in the meter per second scale (Hyoungsoo, et al., 2017). The high-speed flow drives nanoparticles to circulate rapidly in the suspension. When the nanoparticles approach and assemble in the pattern areas, collision of the nanoparticles with the substrate as well as with the sidewall of the pattern occurs. Nanoparticles typically have a significant amount of surface atoms with a high surface energy and a large number of unsaturated dangling bonds, (Grammatikopoulos, et al., 2014, 2019) which, upon collision, tend to coalesce with each other as well as with the substrate and the sidewall of the pattern driven by the forces of surface energy minimization and chemical bonds formation (Henz, et al., 2009; De Yoreo, et al., 2015). During the coalescence process, the decrease of the surface energy combined with the formation of new bonds causes considerable heat release, resulting in an instantaneous increase in particle temperature for hundreds of degrees (Henz, et al., 2009; Lehtinen, et al., 2001). This can lead to the self-annealing of the 5 nm silver nanoparticles whose melting point is much lower than their bulk phase (Ko, et al., 2007). With the increase of the nanoparticle size, the fraction of the surface atoms decreases and the melting point of the nanoparticles increases dramatically and approaches their bulk value, causing the elimination of the self-annealing behavior (Henz, et al., 2009).

Figure 4G:
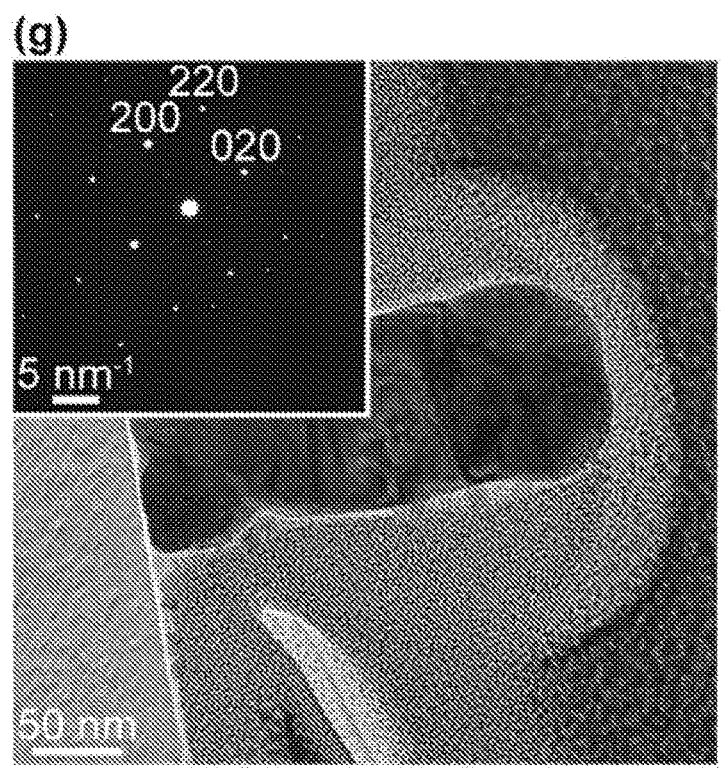
Figure 4H:
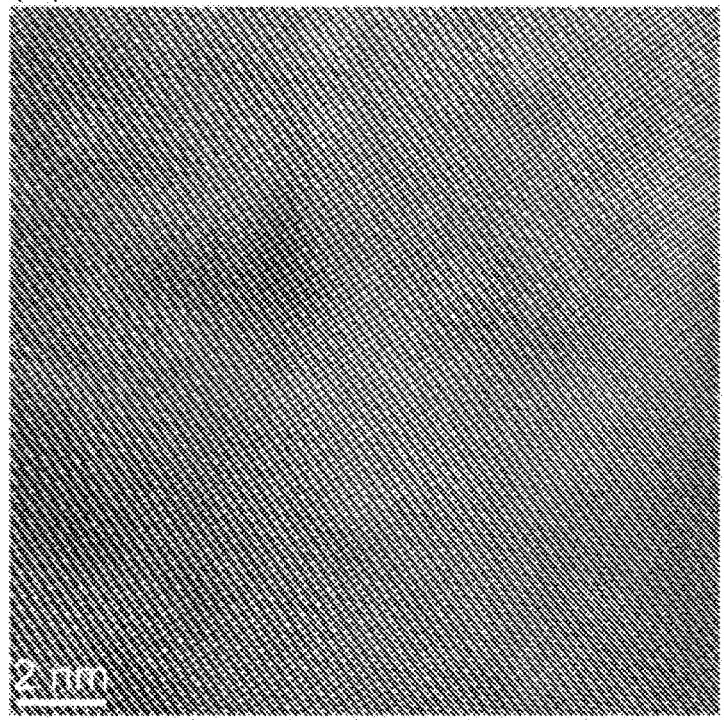
Figure 4I:
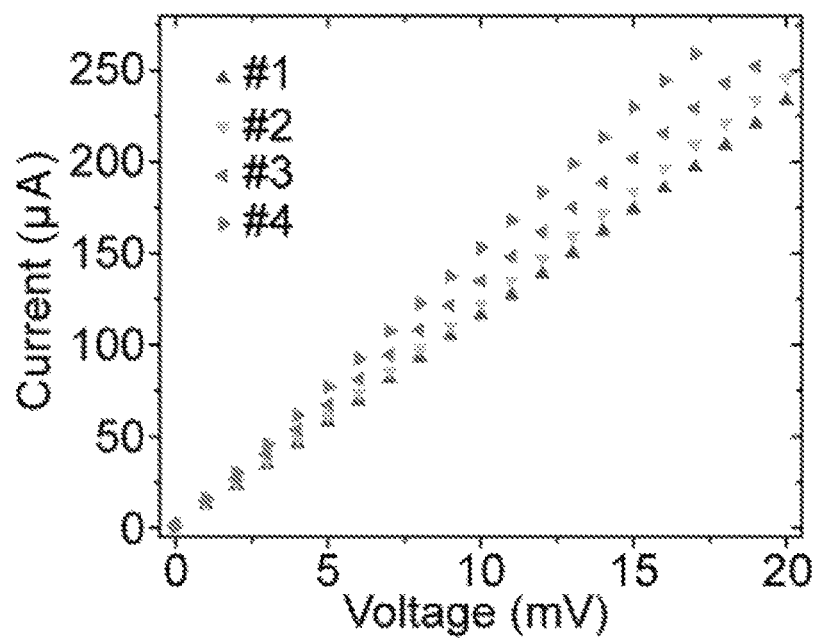
Figure 12A:
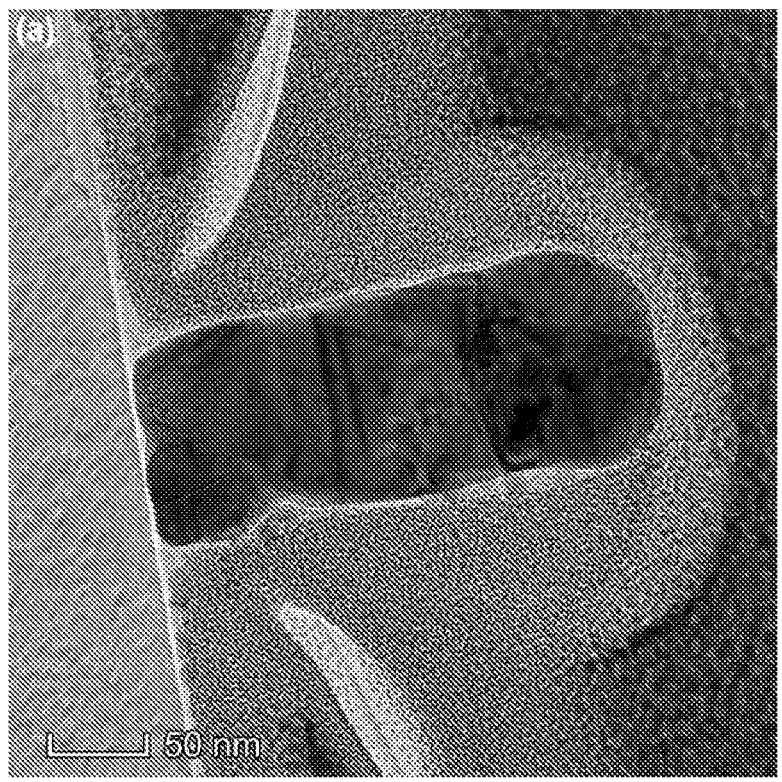
FIG. 12A shows a TEM image of a single silver nanorod.
Figure 12B:
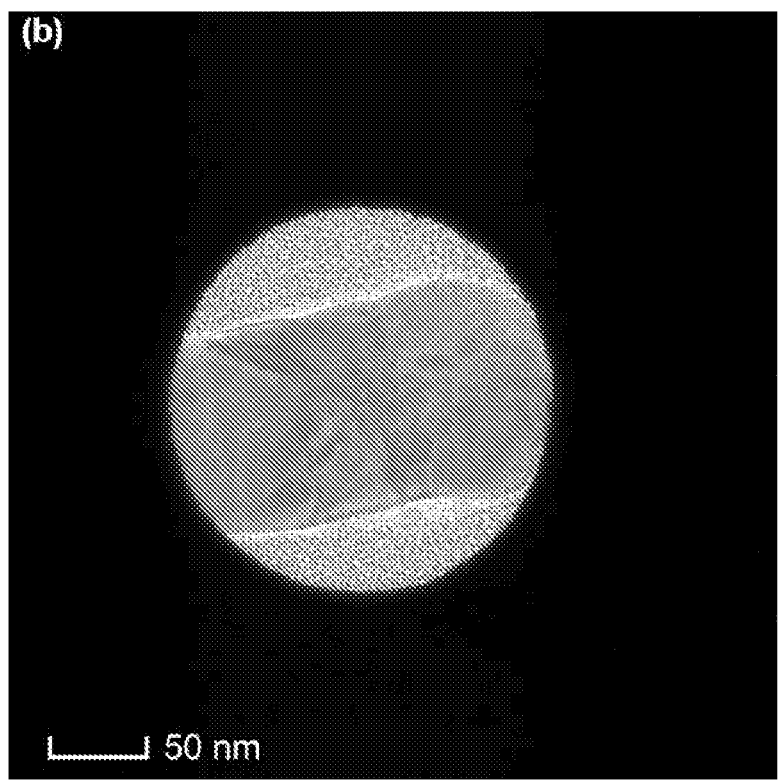
FIG. 12B shows the region where an SAED pattern is obtained.
Figure 13A:
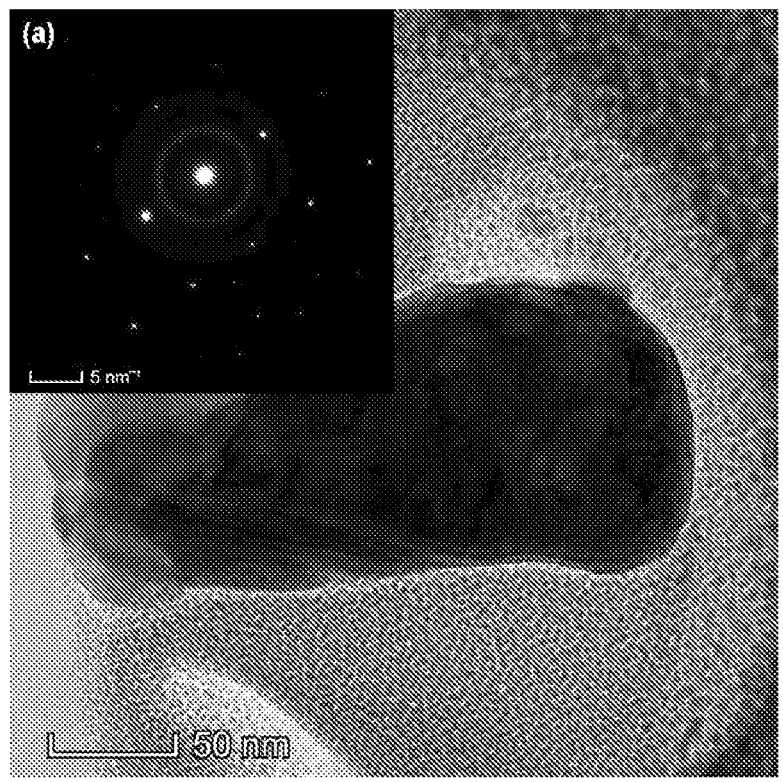
FIGS. 13A-13B show TEM images and corresponding SAED patterns of individual silver nanorods.
Figure 13B:
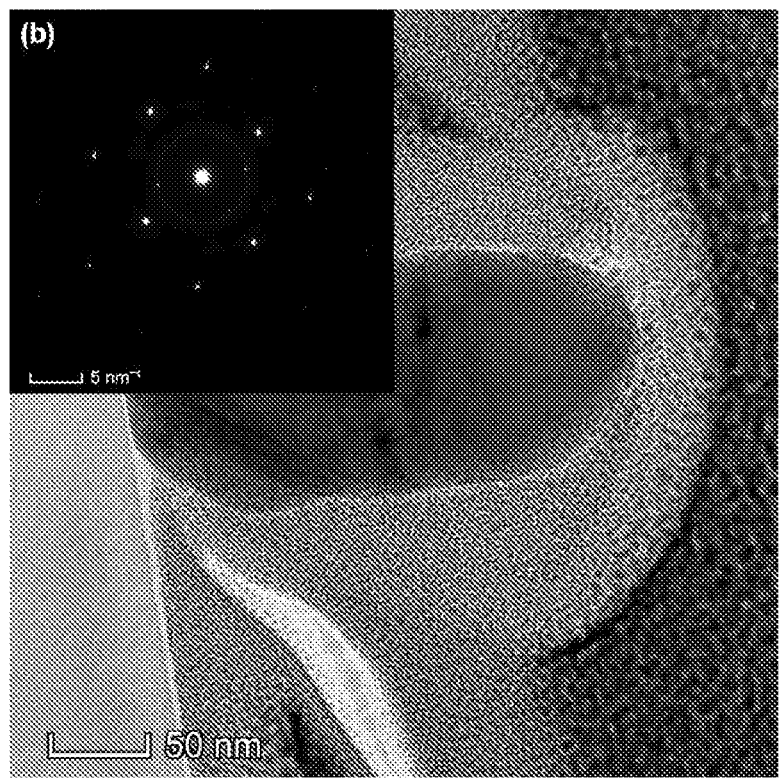

To determine the crystalline structure of the sintered silver nanostructures, a transmission electron microscopy (TEM) sample is prepared using focused ion beam (FIB). FIG. 4G shows a TEM image of a printed silver nanorod at a low magnification. FIG. 12B shows an example region where an SAED pattern is obtained. The selected area electron diffraction (SAED) pattern obtained from a part of the nanorod (FIG. 12B) is presented in the inset to FIG. 4G. The SAED pattern can be indexed to the [001] zone axis of face-centered cubic (fcc) silver, implying the single crystalline nature of the fabricated nanorod. The single crystal structure of the silver nanorod is confirmed by the single directional lattice fringes in the high resolution TEM (HRTEM) image (FIG. 4H). TEM images and SAED patterns of two more silver nanorods show the same single crystalline property as shown in FIG. 13A and in FIG. 13B. To demonstrate the possibility of using sintered silver in nanoelectronics, the electrical properties of silver nanorods assembled on a gold film coated silicon substrate are characterized as shown in FIG. 14A, FIG. 14B, FIG. 14C, and FIG. 14D. FIG. 4I shows current-voltage (IV) curves of the printed silver nanorods 50 nm in diameter and 150 nm in height. The IV curves are linear, representing ohmic conductive behavior of the silver nanorods. The lowest resistivity for four different nanorods is $8.58 \times 10^{-5}$ $\Omega$ cm, which is one order of magnitude higher than the bulk resitivity of silver ($1.59 \times 10^{-6}$ $\Omega$ cm) and close to a gold nanopillar that has been assembled (Yilmaz, et al. 2014). One possible reason for the high resistivity value is that the contact resistance at the probe/nanorod and nanorod/gold substrate interfaces is included in the nanorod resistance during calculation. Another possible reason for the high resistivity of the silver nanorods is their nanoscale dimension. When the diameter of the nanorods becomes equal or less than the mean free path of the corresponding bulk metal, ~51 nm for silver, (Huang, et al., 2009), their resistivity increases because of electron scattering at the surface (Critchley, et al., 2010).

Figure 5A:
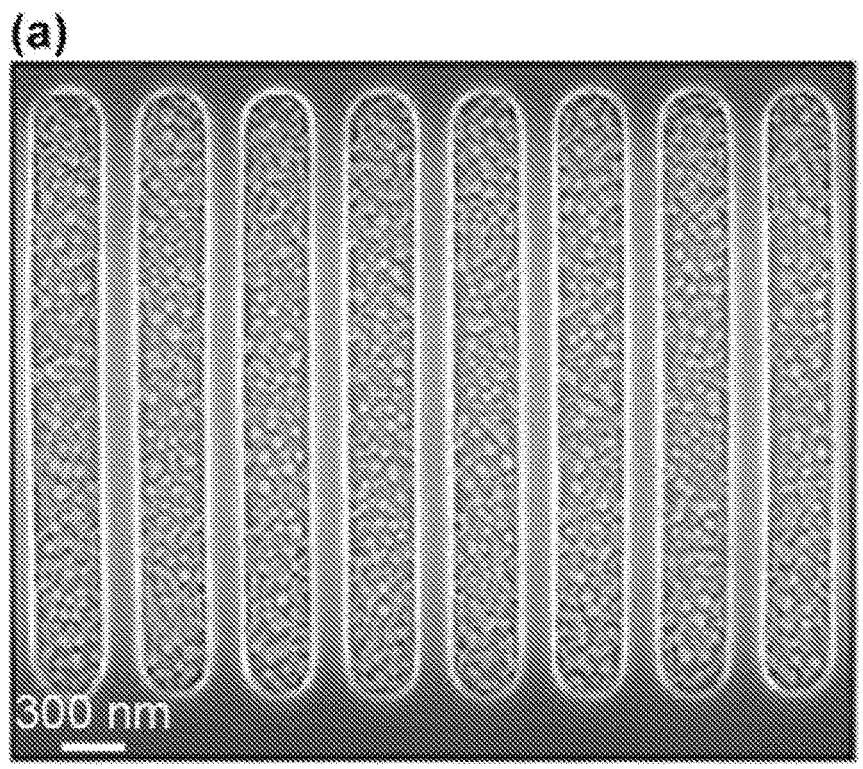
FIGS. 5A-5F show assembly of 51 nm PSL nanoparticles in (FIG. 5A) trenches 300 nm in width, (FIG. 5B) S-shaped trenches 300 nm in width, and (FIG. 5C) diamond-shaped vias.
Figure 5B:
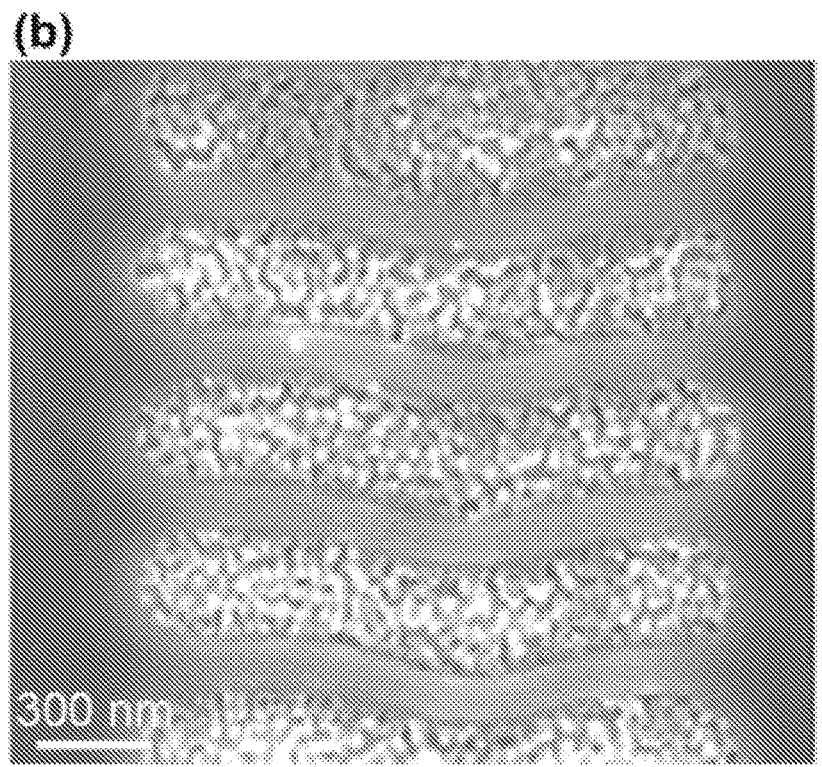
Figure 5C:
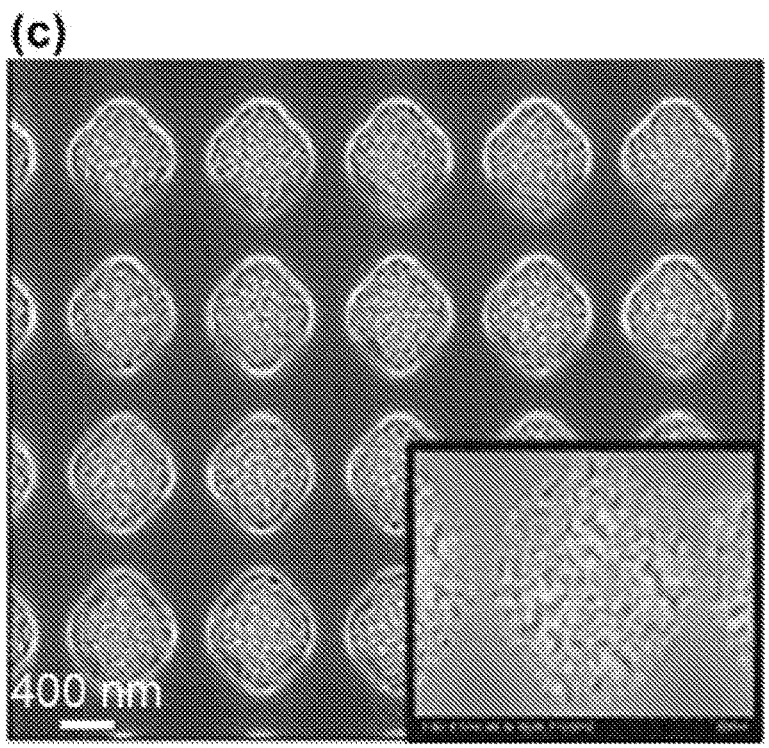
Figure 5D:
Figure 5E:
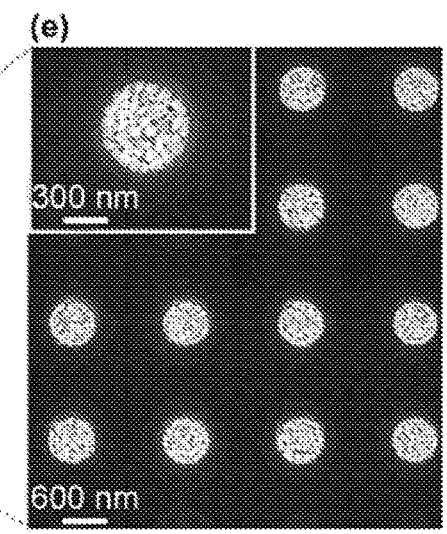
Figure 5F:
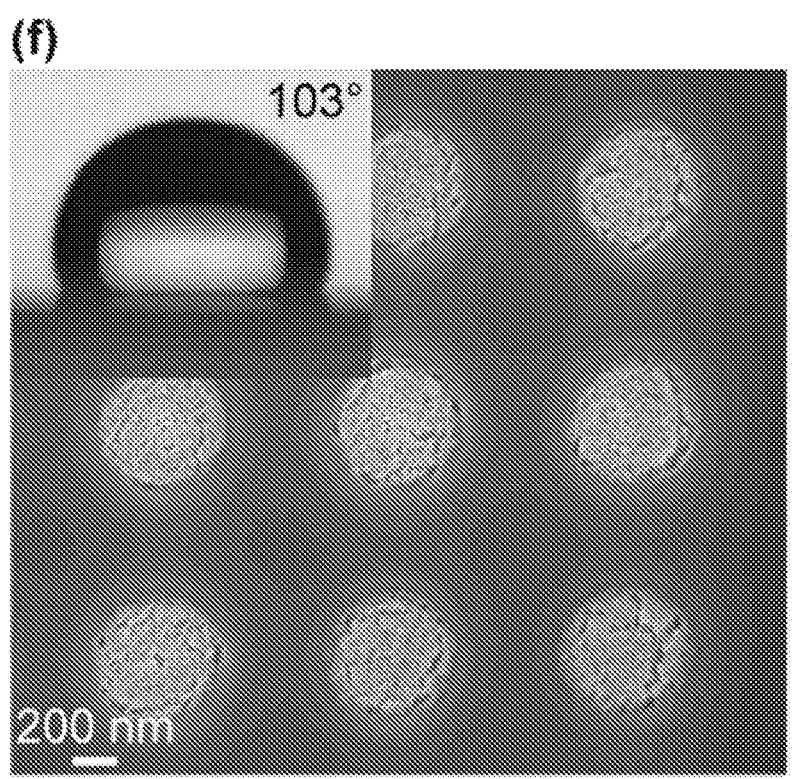
Figure 15:
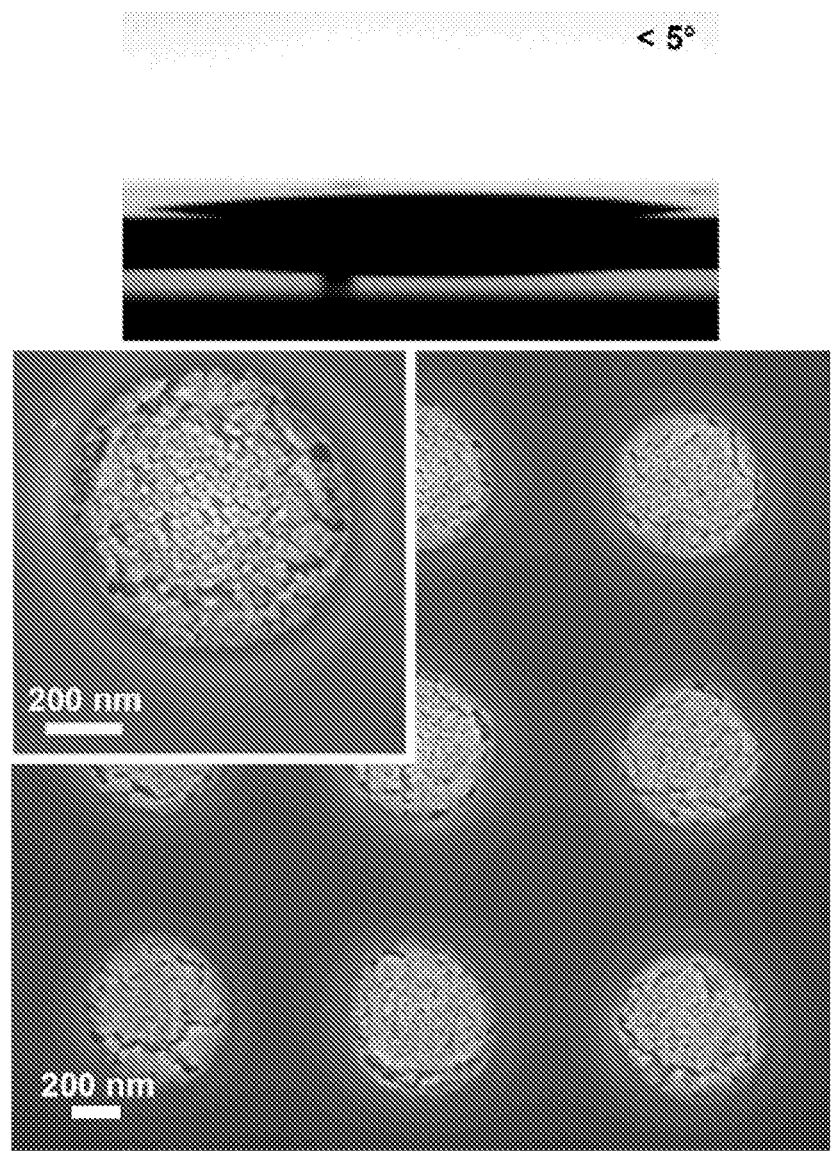
FIG. 15 shows SEM images of 30 nm silica nanoparticles assembled on a hydrophilic surface in vias 600 nm in diameter.

To further demonstrate the versatility of the interfacial convective assembly, PSL nanoparticles with a diameter of 51 nm are assembled in several types of nanostructures, including trenches (FIG. 5A), S-shaped trenches (FIG. 5B) and diamonds (FIG. 5C). 100 nm fluorescent silica nanoparticles are assembled in an array of vias 600 nm in diameter, resembling a world map (FIG. 5D and FIG. 5E). The size of the world map in FIG. 5D is 120 μm×80 μm, demonstrating the scalability of the assembly process. Particles can be assembled whether the pattern areas are hydrophilic or hydrophobic (FIG. 5F and FIG. 15). FIG. 5F shows assembly of 30 nm silica nanoparticles in hydrophobic vias 600 nm in diameter. FIG. 15 shows assembly of 30 nm silica nanoparticles in hydrophilic vias 600 nm in diameter.

EXAMPLES

Example 1. Materials and Characterizations

Particle Suspensions

The fluorescent silica particle (nominal diameters: 30 nm, 100 nm, 1 μm and 3 μm) suspensions with concentrations of 25 mg/mL (30 nm particle) and 50 mg/mL (100 nm, 1 μm and 3 μm particles) were purchased from Kisker Biotech GmbH & Co. KG. The PSL nanoparticle (nominal diameter: 51 nm) suspension with a concentration of 10 mg/mL was purchased from Thermo Fisher Scientific. The gold nanoparticle (nominal diameter: 50 nm) and silver nanoparticle (nominal diameters: 5 nm and 25 nm) suspensions with a concentration of 5 mg/mL were purchased from nanoComposix. All the particles suspensions were directly used as received.

Substrate Preparation

A 15 mm×15 mm silicon chip diced from a wafer was used as a substrate for assembly. The substrate was cleaned with piranha solution (sulfuric acid (98%)/hydrogen peroxide (30%), 2:1) for 3 minutes, rinsed in deionized water for 5 minutes and dried with high purity nitrogen. The piranha clean removes organic contaminations on the surface as well as renders the surface hydrophilic. To fabricate microscale patterns on the substrate, a photoresist (SU8-2010, Micro- Chem Corp.) was spin coated on the substrate and then patterned via optical photolithography, while for the nanoscale patterns, an E-beam resist (950 PMMA, MicroChem Corp.) and E-beam lithography were utilized.

Microscale Pattern Fabrication

To fabricate microscale patterns, a SU8 photoresist (SU8-2010, MicroChem Corp.) was spin coated on a substrate at 500 rpm for 5 seconds with acceleration of 100 rpm/s and then at 3000 rpm for 30 seconds with acceleration of 300 rpm/s. After spinning, the SU8 was pre-baked at 65° C. for 1 minute and soft baked at 95° C. for 2 minutes on a hot plate, and then exposed under ultraviolet (UV, Quintel 4000 mask aligner) light for 10 seconds to generate micropatterns. Following exposure, a post expose bake (PEB) was performed at 65° C. for 1 minute and 95° C. for 2 minutes. After the PEB, the SU-8 resist was developed in the SU-8 developer (1-methoxy-2-proponal acetate) for 2 minutes, rinsed in IPA and then dried by spinning.

Nanoscale Pattern Fabrication

To fabricate nanoscale patterns, PMMA (950 PMMA, MicroChem Corp.) films with thickness between 50 nm and 500 nm were spin coated on a substrate at 5000 rpm for 60 seconds and subsequently baked in an oven at 100° C. for 30 minutes. Then the PMMA films were patterned using E-beam lithography to obtain nanopatterns such as trenches and vias with a minimum dimension of 30 nm. An exposure voltage of 30 kV, an exposure current of 40 pA and an exposure dose of 2 nC/cm were utilized. After exposure, the PMMA films were developed in methyl isobutyl ketone/isopropyl alcohol (MIBK/IPA, 1:3) solution for 80 seconds, in IPA for 30 seconds, and then in deionized water for 5 minutes, respectively.

Characterization of Assembled Structures

The fluorescence microscope images were taken using an Optiphot 200 micropscope (Nikon). A blue filter was used to excite green light from the fluorescent nanoparticles. The SEM and AFM images were collected by Supra 25 (Carl Zeiss) and NX 20 (Park System) microscopes, respectively. The TEM samples were cut using Scios DualBeam FIB system (FEI) and then imaged using Titan Themis 300 S/TEM (FEI). The SAED pattern was completed using a condenser aperture as small as 200 nm, enabling to selectively illuminate the area of interest. The electrical properties of the fabricated silver nanorod were measured using a semiconductor parameter analyzer (HP 4156C, Agilent Technologies) and a NanoManipulator (Zyvex S-100).

Example 2. Interfacial Convective Assembly Using Mixed Solvent Suspensions

Figure 6:
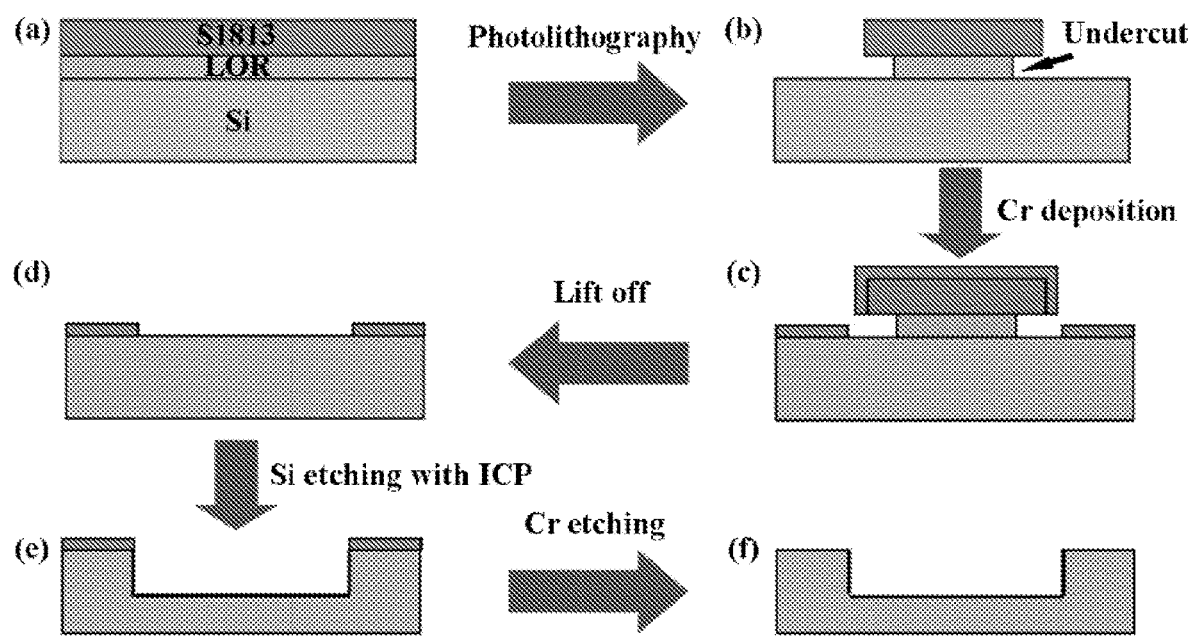
FIG. 6 is a schematic diagram of a process used to prepare a patterned silicon substrate.

Since photoresist or E-beam resist may be dissolved in certain solvents, a new substrate fabrication process was investigated, as depicted in FIG. 6. A silicon wafer was cleaned using acetone, IPA, and oxygen plasma (Anatech SP-100) to remove organic contaminants. An oxygen flow of 15 sccm, a power of 100 W, and an etching time of 1 minute were utilized. A LOR-1A resist (MicroChem Corp.) was spin coated on the substrate and baked at 190° C. for 6 minutes on a hot plate. A positive photoresist (Shipley 1813) was spin coated on the LOR resist and baked at 115° C. for 1 minute. Then, the sample was exposed under UV light for 3.5 seconds and developed in an AZ 726 MIF developer (MicroChem Corp.) for 30 seconds. A 50 nm thick chromium (Cr) film was deposited on the patterned substrate using an E-beam evaporator and then lifted off using remover 1165 (Shipley). Following the lift off process, the silicon substrate was etched anisotropically by inductively coupled plasma (ICP, Unaxis PlasmaTherm 790) to obtain 3.5 µm deep structures. The ICP etching was performed using RF1 power 250 W, RF2 power 300 W, $SF_6$ flow 6 sccm and Ar flow 4 sccm at a chamber pressure of 5 mTorr for 3 minutes. Following the dry etching process, the Cr film was etched away using Cr etchant (Transene) at 40° C. Afterwards, the silicon wafer was diced into 15 mm×15 mm chips. The patterned silicon chips were exposed to oxygen plasma to terminate their surface with hydroxyl (OH) groups and then coated with FOTS (trideca-fluoro-1,1,2,2-tetrahydrooctyltrichlorosilane) self-assembled monolayers at 150° C. for 30 minutes in a vacuum oven to make the surface hydrophobic (contact angle 103°).

The effect of the solvent on the interfacial convective assembly process was studied using the above described silicon template. FIG. 7A shows fluorescence images of 1 µm silica particles assembled in 20 µm wide trenches when water-IPA mixed suspensions were used. FIG. 7B shows fluorescence images of 1 µm silica particles assembled in 20 µm wide trenches when water only suspensions were used. A substrate temperature of 40° C., a particle concentration of 50 mg/ml, and an assembly time of 20 minutes were used. The trenches are fully filled when water-IPA mixed suspension is used, while only ~12.5% of the trenches are filled when water only suspension is used.

In the interfacial convective assembly, mixing of IPA and the particle suspension can cause a mixing-induced solutal Marangoni flow. To study if the mixing-induced Marangoni flow contributes to the assembly, two comparative experiments were conducted. In the first experiment, a patterned substrate was sonicated in an IPA bath for a few seconds and then removed from the IPA bath, leaving an IPA film on the substrate. Then, 50 µL aqueous silver nanoparticle suspension was drop casted on the IPA film and immediately mixed with the IPA film, resulting a suspension with ~20 wt % IPA. A glass slide was used to cover the suspension. Then, the substrate was heated on a hot plate at 30° C. for 60 seconds. In the second experiment, the silver nanoparticle suspension was mixed with IPA (20 wt %) in advance. Then, 50 µL mixed suspension was drop cast on the patterned substrate directly. Then, as in the first experiment, the substrate was heated on a hot plate at 30° C. for 60 seconds. FIG. 8A and FIG. 8B show the assembly results using non-premixed and premixed silver nanoparticle suspensions, respectively. The assembly results look similar, which means that the mixing-induced solutal Marangoni convective flow does not contribute much to the assembly. Because the mixing happens in only a few seconds, the contribution of the mixing-induced Marangoni flow to the assembly is negligible.

Figure 14A:
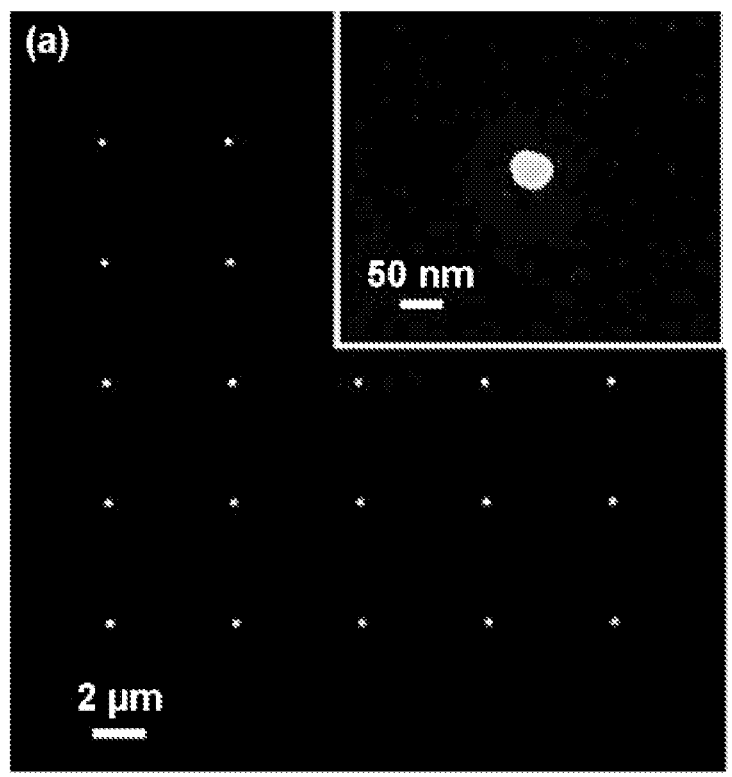
FIG. 14A shows SEM images of 5 nm silver nanoparticles assembled in an array of 50 nm vias.

Example 3. Characterization of Electrical Properties of Assembled Silver Nanorods The electrical properties of the assembled silver nanorods were characterized using a Zyvex S-100 nanomanipulator combined with SEM and a semiconductor parameter analyzer. The substrate was a 100 nm thick gold film deposited on a silicon wafer with a 5 nm thick chromium adhesion layer. A 150 nm thick PMMA film was spin coated on the gold film coated silicon substrate and then patterned using E-beam lithography to get an array of 50 nm vias. 5 nm silver nanoparticles were then assembled in the vias to form nanorods with a diameter of 50 nm and a height of 150 nm, as shown in FIG. 14A.

Figure 14B:
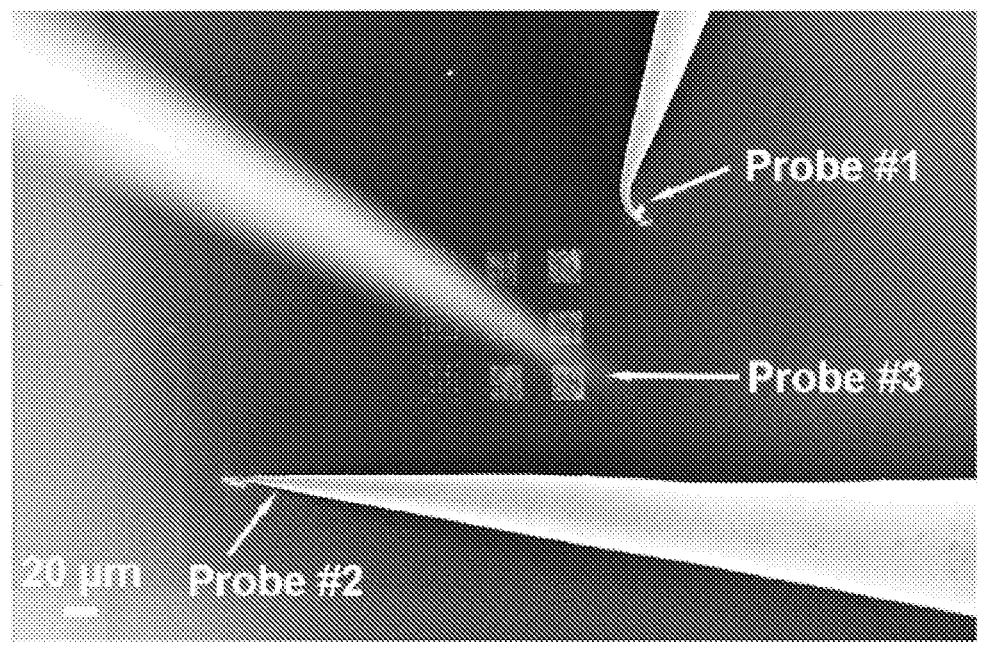
FIG. 14B is an SEM image showing the layout of three tungsten probes.
Figure 14C:
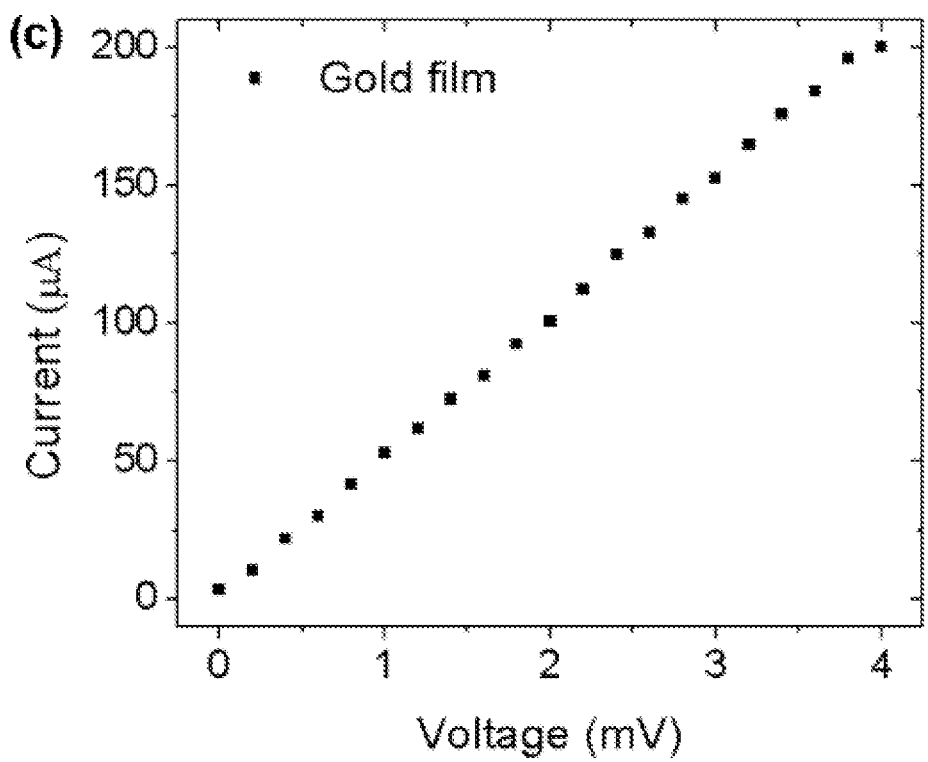
FIG. 14C shows an I-V curve of a gold film deposited on a silicon substrate.
Figure 14D:
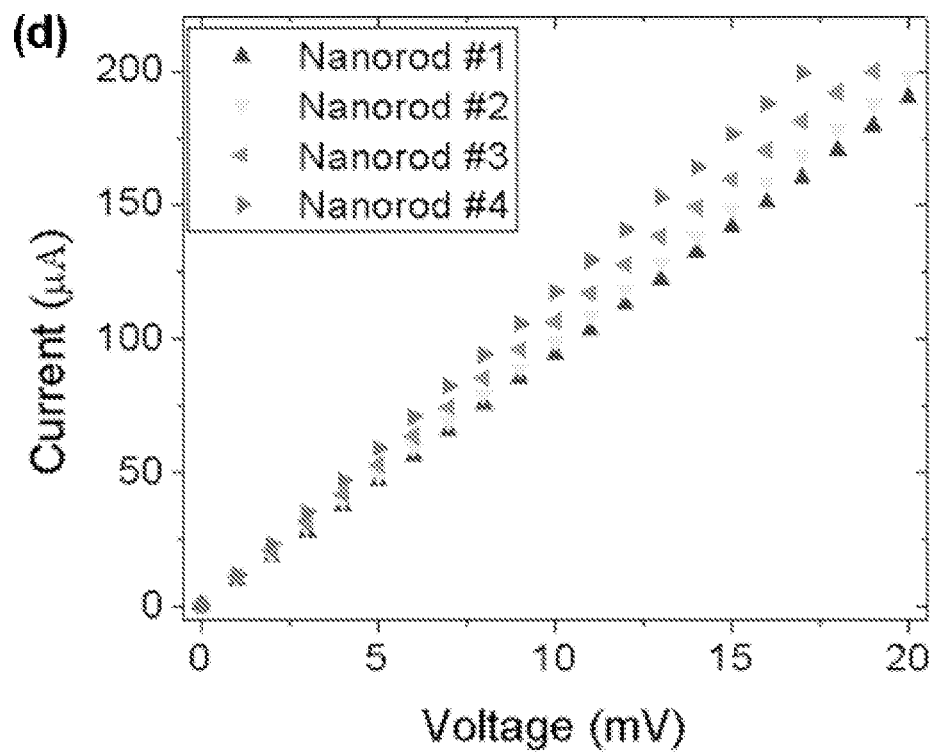
FIG. 14D shows I-V curves of four assembled silver nanorods 50 nm in diameter and 150 nm in height (including the contribution from the gold film).

A three-probe system was utilized during the measurements, as shown in FIG. 14B. The probes used were tungsten probes with a tip diameter of 20 nm. Probes 1 and 2 were landed on the gold film by piercing through the PMMA film. Probe 3 was landed on the top of the silver nanorods. Firstly, the I-V curve between probes 1 and 2 was measured, as shown in FIG. 14C. By dividing the voltage by the current, the resistance of the gold film ($R_g$) was calculated to be 19.7Ω. Then, the I-V curves between probes 1 and 3 were measured when landing probe 3 on different nanorods, as shown in FIG. 14C. Because the gold film was included in the circuit, a compound resistance ($R_{gs}$) including the contributions from both the gold film ($R_g$) and the silver nanorods ($R_s$) was obtained when dividing the voltage by the current:

$$R_{gs} = R_g + R_s \quad \text{(Eq. 6)}$$

The resistances of each silver nanorod were obtained by subtracting the resistance of the gold film from the compound resistance. Results are listed in Table 3. Using the resistances of the silver nanorods, IV curves which exclude the contribution from the gold film were regenerated, as shown in FIG. 4I. Resistivity of the silver nanorods was calculated as:

$$\rho = \frac{R_s \pi (d/2)^2}{h} \quad \text{(Eq. 7)}$$

where d and h are the diameter and height of the silver nanorods, respectively. The calculated resistivities of the silver nanorods are also listed in Table 3. An average resistivity was calculated to be $1.01 \times 10^{-4}$ Ω cm with a standard deviation of $0.12 \times 10^{-4}$ Ω cm.

TABLE 3

Resistance and resistivity of the silver nanorods.

| Nanorod | Resistance (Ω) | Resistivity (Ω cm) |
| --- | --- | --- |
| #1 | 86.3 | $1.13 \times 10^{-4}$ |
| #2 | 81.5 | $1.07 \times 10^{-4}$ |
| #3 | 74.3 | $9.72 \times 10^{-5}$ |
| #4 | 65.6 | $8.58 \times 10^{-5}$ |

Example 4. Assembly in Hydrophilic/Hydrophobic Patterns

To investigate the effect of the hydrophobic/hydrophilic property on the assembly, two templates with different wettabilities were fabricated. For the first template, a substrate was cleaned using piranha solution to make the surface hydrophilic with a contact angle of below 5°. A 400 nm thick PMMA film was spin coated onto the substrate and then patterned using E-beam lithography to obtain an array of 600 nm vias. The contact angle of the PMMA film was 64°, creating a template with a contrast of wettability. For the second template, all the steps in fabricating the first template were followed. Then the whole template was functionalized using FOTS self-assembled monolayers. The contact angle of the functionalized template was 103°. Assembly of 30 nm silica nanoparticles was carried out using both two templates. Full assembly could be achieved for both cases, as shown in FIG. 5F, which shows assembly of 30 nm silica nanoparticles in the hydrophobic (contact angle 103° vias 600 nm in diameter, and in FIG. 15, which shows assembly of 30 nm silica nanoparticles in more hydrophilic (contact angle 64°) vias 600 nm in diameter.

REFERENCES

Yilmaz, C.; A. E. Cetin, G. Goutzamanidis, J. Huang, S. Somu, H. Altug, D. G. Wei, A. Busnaina, *Three-Dimensional Crystalline and Homogeneous Metallic Nanostructures Using Directed Assembly of Nanoparticles*, ACS Nano 2014, 5, 4547.

Malaquin, L.; T. Kraus, H. Schmid, E. Delamarche, H. Wolf, *Controlled Particle Placement Through Convective and Capillary Assembly*, Langmuir 2007, 23, 11513.

de Bruyn, J. R.; E. Bodenschatz, S. W. Morris, S. P. Trainoff, Y. Hu, D. S. Cannell, G. Ahlers, Rev. Sci. Instrum. 1996, 6, 2043; *Apparatus for the Study of Rayleigh—Bénard Convection*, U. of California, 2002.

Chen, J. J.; J. F. C. Loo, D. P. Wang, Y. Zhang, S. K. Kong, H. P. Ho, *Thermal Optofluidics: Principles and Applications*, Adv. Opt. Mater. 2019, 8, 1900829.

Gargiulo, J.; T. Brick, I. L. Violi, F. C. Herrera, T. Shibanuma, P. Albella, F. G. Requejo, E. Cortés, S. A. Maier, F. D. Stefani, *Understanding and Reducing Photothermal Forces for the Fabrication of Au Nanoparticle Dimers by Optical Printing*, Nano Lett. 2017, 9, 5747.

Winterer, F.; C. M. Maier, C. Pernpeintner, T. Lohmüller, *Optofluidic Transport and Manipulation of Plasmonic Nanoparticles by Thermocapillary Convection*, Soft Matter 2018, 4, 628.

Cross, M. C.; P. C. Hohenberg, *Pattern Formation Outside of Equilibrium*, Rev. Mod. Phys. 1993, 3, 851.

Namura, K.; K. Nakajima, M. Suzuki, *Investigation of Transition From Thermal-to Solutal-Marangoni Flow in Dilute Alcohol/Water Mixtures Using Nano-Plasmonic Heaters*, Nanotechnology 2018, 6, 065201.

Hu, Y.; S. Chen, J. Huang, M. Song, *Marangoni Effect on Pool Boiling Heat Transfer Enhancement of Self-Rewetting Fluid*, Int. J. Heat Mass Transfer 2018, 127, 1263.

Vazquez, G.; E. Alvarez, J. M. Navaza, *Surface Tension of Alcohol Water+Water from 20 to 50 degree C*, J. Chem. Eng. Data 1995, 3, 611.

Enders, S.; H. Kahl, J. Winkelmann, *Surface Tension of the Ternary System Water+Acetone+Toluene*, J. Chem. Eng. Data 2007, 3, 1072.

Hyoungsoo, K.; M. Koen, S. Orest, A. Shahriar, A. S. Howard, *Solutal Marangoni Flows of Miscible Liquids Drive Transport Without Surface Contamination*, Nat. Phys. 2017, 13, 1105.

Grammatikopoulos, P.; M. Sowwan, J. Kioseoglou, *Computational Modeling of Nanoparticle Coalescence*, Adv. Theory Simul. 2019, 6, 1900013.

Mariscal, M. M.; S. A. Dassie, E. P. M. Leiva, *Collision as a Way of Forming Bimetallic Nanoclusters of Various Structures and Chemical Compositions*, J. Chem. Phys. 2005, 18, 184505.

Grammatikopoulos, P.; C. Cassidy, V. Singh, M. Sowwan, *Coalescence-Induced Crystallisation Wave in Pd Nanoparticles*, Sci. Rep. 2014, 1, 5779.

Henz, B. J.; T. Hawa, M. Zachariah, *Molecular Dynamics Simulation of the Energetic Reaction Between Ni and Al Nanoparticles*, J. Appl. Phys. 2009, 12, 124310.

De Yoreo, J. J.; P. U. P. A. Gilbert, N. A. J. M. Sommerdijk, R. L. Penn, S. Whitelam, D. Joester, H. Zhang, J. D. Rimer, A. Navrotsky, J. F. Banfield, A. F. Wallace, F. M. Michel, F. C. Meldrum, H. Cölfen, P. M., Dove, *Crystallization by Particle Attachment in Synthetic, Biogenic, and Geologic Environments*, Science 2015, 6247, aaa6760.

Lehtinen, K. E. J.; M. R. Zachariah, *Effect of Coalescence Energy Release on the Temporal Shape Evolution of Nanoparticles*, Phys. Rev. B 2001, 20, 205402.

Ko, S. H.; I. Park, H. Pan, C. P. Grigoropoulos, A. P. Pisano, C. K. Luscombe, J. M. J. Fréchet, *Direct Nanoimprinting of Metal Nanoparticles for Nanoscale Electronics Fabrication*, Nano lett. 2007, 7, 1869.

Huang, Q.; C. M. Lilley, M. Bode, *Surface Scattering Effect on the Electrical Resistivity of Single Crystalline Silver Nanowires Self-Assembled on Vicinal Si* (001), Appl. Phys. Lett. 2009, 10, 103112.

Critchley, K.; B. P. Khanal, M. . Górzny, L. Vigderman, S. D. Evans, E. R. Zubarev, N. A. Kotov, *Near-Bulk Conductivity of Gold Nanowires as Nanoscale Interconnects and the Role of Atomically Smooth Interface*, Adv. Mater. 2010, 21, 2338.

What is claimed is:

1. A method of interfacial convective assembly of nanoelements, the method comprising the steps of:
    (a) providing a patterned substrate and a suspension of nanoelements in a binary solvent system, the binary solvent system comprising a first component and a second component, wherein the first component has a higher volatility and a lower surface tension than the second component;
    (b) depositing the suspension on the substrate;
    (c) confining the suspension, or a portion thereof, within an enclosed space on the substrate;
    (e) heating the substrate, thereby inducing convective flow in the binary solvent system, wherein the convective flow comprises solutal Marangoni convective flow in a direction towards the patterned substrate, and wherein the solutal Marangoni convective flow induces a total convective flow of at least about 1 m·s$^{-1}$;
    whereby nanoelements of the suspension are transferred to and bind to one or more areas of the patterned substrate.

2. The method of claim 1, wherein the first component of the binary solvent system comprises one or more of acetaldehyde, acetic acid, acetone, acetonitrile, butanol, ethanol, ethylene glycol, 1-propanol, isopropanol, methanol, n-butyl acetate, pyridine, hydrazine, and tetrahydrofuran, and wherein the second component of the binary solvent system is water.

3. The method of claim 1, wherein the one or more areas of the patterned substrate onto which nanoelements are transferred have a contact angle from 0° to about 130°.

4. The method of claim 1, wherein the one or more areas of the patterned substrate onto which nanoelements are transferred have substantially the same contact angle as areas of the patterned substrate that do not bind nanoelements.

5. The method of claim 1, wherein the one or more areas of the patterned substrate onto which nanoelements are transferred have a lower contact angle than areas of the patterned substrate that do not bind nanoelements.

6. The method of claim 1, wherein the one or more areas of the patterned substrate onto which nanoelements are transferred are sunken below areas of the patterned substrate that do not bind nanoelements, and wherein the difference in height between the areas that do and do not bind nanoelements is at least about the same as the size of the nanoelements.

7. The method of claim 6, wherein nanoelements are deposited into vias or trenches of the patterned substrate.

8. The method of claim 1, wherein the patterned substrate has at least one pattern feature having a dimension in the range from about 1 nm to about 1000 nm.

9. The method of claim 8, wherein the patterned substrate has at least one pattern feature having a dimension in the range from about 5 nm to about 100 nm.

10. The method of claim 1, wherein the binary solvent system is formed by drop casting an aqueous suspension of said nanoelements onto a film comprising the first component of the binary solvent system.

11. The method of claim 1, wherein confining the suspension comprises placing a cover over the suspension.

12. The method of claim 1, further comprising
    (e) tilting the patterned substrate, whereby non-transferred nanoelements are removed from the patterned substrate.

13. The method of claim 1, wherein the patterned substrate is heated in (d) to a temperature in the range from about 40° C. to about 75° C.

14. The method of claim 1, wherein the method is completed in less than 10 minutes.

15. The method of claim 1, wherein a patterned monolayer of the nanoelements is deposited onto the substrate.

16. The method of claim 1, wherein the nanoelements are nanoparticles comprising gold, silver, one or more polymers, carbon, silica, or a combination thereof.

17. The method of claim 16, wherein at least a portion of the transferred nanoparticles fuse together to form a fused nanoparticle structure.

18. The method of claim 1, wherein the method does not include electrophoretic or dielectrophoretic assembly of the nanoelements.

19. A method of fabricating a patterned multilayered nanomaterial, the method comprising performing the method of claim 1 to assemble a first patterned monolayer of nanoelements followed by repeating the method one or more times to add additional monolayers of the nanoelements on top of the previous monolayer or layers.

* * * * *